United States Patent
Zou et al.

(10) Patent No.: US 11,302,895 B2
(45) Date of Patent: Apr. 12, 2022

(54) DISPLAY SUBSTRATE HAVING SEPARATION PILLAR IN THE PERIPHERAL AREA, DISPLAY APPARATUS, AND METHOD OF FABRICATING DISPLAY SUBSTRATE HAVING THE SAME

(71) Applicants: Chengdu BOE Optoelectronics Technology Co., Ltd., Sichuan (CN); BOE Technology Group Co., Ltd., Beijing (CN)

(72) Inventors: Fuwei Zou, Beijing (CN); Yue Wei, Beijing (CN); Kangguan Pan, Beijing (CN); Fei Li, Beijing (CN); Huimin Cao, Beijing (CN); Zhen Zhang, Beijing (CN); Xia Tang, Beijing (CN); Lei Deng, Beijing (CN); Wei Deng, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 96 days.

(21) Appl. No.: 16/962,715

(22) PCT Filed: Sep. 25, 2019

(86) PCT No.: PCT/CN2019/107835
§ 371 (c)(1),
(2) Date: Jul. 16, 2020

(87) PCT Pub. No.: WO2021/056261
PCT Pub. Date: Apr. 1, 2021

(65) Prior Publication Data
US 2021/0408474 A1 Dec. 30, 2021

(51) Int. Cl.
*H01L 29/08* (2006.01)
*H01L 51/52* (2006.01)
(Continued)

(52) U.S. Cl.
CPC ...... *H01L 51/5253* (2013.01); *H01L 27/3234* (2013.01); *H01L 27/3258* (2013.01);
(Continued)

(58) Field of Classification Search
CPC ............ H01L 27/3234; H01L 27/3258; H01L 27/3265; H01L 51/5253; H01L 51/5228; H01L 2227/323
(Continued)

(56) References Cited

U.S. PATENT DOCUMENTS

2017/0053973 A1  2/2017  Park et al.
2017/0244061 A1  8/2017  Jin et al.
(Continued)

FOREIGN PATENT DOCUMENTS

CN    106783926 A    5/2017
CN    107785502 A    3/2018
(Continued)

OTHER PUBLICATIONS

First Office Action in the Chinese Patent Application No. 2019800017944, dated Aug. 31, 2021; English translation attached.

*Primary Examiner* — Phuc T Dang
(74) *Attorney, Agent, or Firm* — Intellectual Valley Law, P.C.

(57) ABSTRACT

A display substrate having a display area and a peripheral area is provided. The display substrate includes a plurality of light emitting elements on a base substrate and in the display area; an encapsulating layer on a side of the plurality of light emitting elements away from the base substrate; and a first separation pillar in the peripheral area and on the base
(Continued)

substrate, the first separation pillar forming a first enclosure substantially surrounding a first area. The first separation pillar includes a plurality of metal layers and a plurality of insulating layers alternately stacked on the base substrate. A width of a respective one of the plurality of insulating layers along a cross-pillar direction across the first enclosure and from the display area toward the first separation pillar is greater than a width of a respective one of the plurality of metal layer along the cross-pillar direction.

20 Claims, 11 Drawing Sheets

(51) Int. Cl.
  *H01L 27/32* (2006.01)
  *H01L 51/00* (2006.01)
  *H01L 51/56* (2006.01)
(52) U.S. Cl.
  CPC ...... *H01L 27/3265* (2013.01); *H01L 51/0023* (2013.01); *H01L 51/5228* (2013.01); *H01L 51/56* (2013.01); *H01L 2227/323* (2013.01)

(58) Field of Classification Search
  USPC .......................................................... 257/40
  See application file for complete search history.

(56) References Cited

U.S. PATENT DOCUMENTS

| | | |
|---|---|---|
| 2019/0123309 A1 | 4/2019 | Lv et al. |
| 2019/0198587 A1 | 6/2019 | Park et al. |
| 2019/0207157 A1* | 7/2019 | Gong ................... H01L 27/3246 |
| 2019/0355930 A1* | 11/2019 | Lee ...................... H01L 51/5253 |
| 2020/0013849 A1* | 1/2020 | Kim ..................... H01L 27/3276 |
| 2020/0135835 A1* | 4/2020 | Seo ...................... H01L 51/5253 |
| 2021/0193958 A1 | 6/2021 | Wang et al. |

FOREIGN PATENT DOCUMENTS

| | | |
|---|---|---|
| CN | 107845667 A | 3/2018 |
| CN | 109742117 A | 5/2019 |
| KR | 20170135587 A | 12/2017 |

* cited by examiner

DISPLAY SUBSTRATE HAVING SEPARATION PILLAR IN THE PERIPHERAL AREA, DISPLAY APPARATUS, AND METHOD OF FABRICATING DISPLAY SUBSTRATE HAVING THE SAME

CROSS-REFERENCE TO RELATED APPLICATION

This application is a national stage application under 35 U.S.C. § 371 of International Application No. PCT/CN2019/107835, filed Sep. 25, 2019, the contents of which are incorporated by reference in the entirety.

TECHNICAL FIELD

The present invention relates to display technology, more particularly, to a display substrate, a display apparatus, and a method of fabricating a display substrate.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD apparatus. An OLED display apparatus typically includes an anode, an organic layer including a light emitting layer, and a cathode. OLEDs can be either a bottom-emission type OLED or a top-emission type OLED.

SUMMARY

In one aspect, the present invention provides a display substrate having a display area and a peripheral area, comprising a base substrate; a plurality of light emitting elements on the base substrate and in the display area; an encapsulating layer on a side of the plurality of light emitting elements distal to the base substrate to encapsulate the plurality of light emitting elements; and a first separation pillar in the peripheral area and on the base substrate, the first separation pillar forming a first enclosure substantially surrounding a first area; wherein the first separation pillar comprises a plurality of metal layers and a plurality of insulating layers alternately stacked on the base substrate; wherein a width of a respective one of the plurality of insulating layers along a cross-pillar direction across the first enclosure and from the display area toward the first separation pillar is greater than a width of a respective one of the plurality of metal layer along the cross-pillar direction.

Optionally, an orthographic projection of the respective one of the plurality of insulating layers on the base substrate is larger than and covers an orthographic projection of the respective one of the plurality of metal layers on the base substrate.

Optionally, the display substrate further comprises an organic functional layer extending substantially throughout the display area as a unitary layer; and a residual organic functional layer in the peripheral area and on a side of the first separation pillar away from the base substrate; wherein the residual organic functional layer and the organic functional layer are in a same layer and comprises a same material; and the residual organic functional layer is isolated from the organic functional layer by a lateral side of the first separation pillar.

Optionally, a width of the residual organic functional layer along the cross-pillar direction is greater than the width of the respective one of the plurality of metal layer along the cross-pillar direction; and an orthographic projection of the residual organic functional layer on the base substrate is larger than and covers an orthographic projection of the respective one of the plurality of metal layers on the base substrate.

Optionally, the display substrate further comprises a cathode layer extending substantially throughout the display area as a unitary layer; and a residual cathode layer in the peripheral area and on a side of the first separation pillar away from the base substrate; wherein the residual cathode layer and the cathode layer are in a same layer and comprises a same material; and the residual cathode layer is isolated from the cathode layer by a lateral side of the first separation pillar.

Optionally, a width of the residual cathode layer along the cross-pillar direction is greater than the width of the respective one of the plurality of metal layer along the cross-pillar direction; and an orthographic projection of the residual cathode layer on the base substrate is larger than and covers an orthographic projection of the respective one of the plurality of metal layers on the base substrate.

Optionally, the first separation pillar comprises a first metal layer on the base substrate; a first insulating layer on a side of the first metal layer away from the base substrate; a second metal layer on a side of the first insulating layer away from the first metal layer; and a second insulating layer on a side of the second metal layer away from the first insulating layer; wherein the first insulating layer is in direct contact with the first metal layer on one side and in direct contact with the second metal layer on another side; and the second metal layer is in direct contact with the first insulating layer on one side and in direct contact with the second insulating layer on another side.

Optionally, the display substrate further comprises a plurality of thin film transistors; wherein a respective one of the plurality of thin film transistors comprises a gate electrode; wherein the display substrate further comprises a gate insulating layer on a side of the gate electrode away from the base substrate; and a capacitor electrode on a side of the gate insulating layer away from the gate electrode; wherein the gate electrode and the first metal layer are in a same layer and comprise a same material, the gate insulating layer and the first insulating layer are in a same layer and comprise a same material; and the capacitor electrode and the second metal layer are in a same layer and comprise a same material.

Optionally, the display substrate further comprises an inter-layer dielectric layer on a side of the capacitor electrode away from the base substrate; wherein the inter-layer dielectric layer and the second insulating layer are in a same layer and comprise a same material.

Optionally, the inter-layer dielectric layer and the second insulating layer comprises an inorganic insulating material.

Optionally, the display substrate further comprises an inter-layer dielectric layer on a side of the capacitor electrode away from the base substrate; and a planarization layer on a side of the inter-layer dielectric layer away from the base substrate; wherein the planarization layer and the second insulating layer are in a same layer and comprise a same material.

Optionally, the planarization layer and the second insulating layer comprises an organic photoresist material.

Optionally, the display substrate further comprises a second separation pillar in the peripheral area and on the base substrate, the second separation pillar forming a second enclosure substantially surrounding a second area; wherein the first separation pillar substantially surrounds the second separation pillar.

Optionally, the first enclosure substantially surrounds a window region of the display substrate; and the display substrate has an aperture extending through the window region for installing an accessory therein.

In another aspect, the present invention provides a display apparatus, comprising the display substrate described herein or fabricated by a method described herein, and one or more integrated circuits connected to the display substrate.

In another aspect, the present invention provides a method of fabricating a display substrate having a display area and a peripheral area, comprising forming a plurality of light emitting elements on a base substrate and in the display area; forming an encapsulating layer on a side of the plurality of light emitting elements distal to the base substrate to encapsulate the plurality of light emitting elements; and forming a first separation pillar in the peripheral area and on the base substrate, the first separation pillar forming a first enclosure substantially surrounding a first area; wherein forming the first separation pillar comprises forming a plurality of metal layers and a plurality of insulating layers alternately stacked on the base substrate; wherein a width of a respective one of the plurality of insulating layers along a cross-pillar direction across the first enclosure and from the display area toward the first separation pillar is greater than a width of a respective one of the plurality of metal layer along the cross-pillar direction.

Optionally, forming the first separation pillar comprises forming a first metal layer on the base substrate; forming a first insulating layer on a side of the first metal layer away from the base substrate; forming a second metal layer on a side of the first insulating layer away from the first metal layer; and forming a second insulating layer on a side of the second metal layer away from the first insulating layer; wherein the first insulating layer is formed to be in direct contact with the first metal layer on one side and in direct contact with the second metal layer on another side; and the second metal layer is formed to be in direct contact with the first insulating layer on one side and in direct contact with the second insulating layer on another side.

Optionally, the method further comprises forming a plurality of thin film transistors; wherein forming a respective one of the plurality of thin film transistors comprises forming a gate electrode; wherein the method further comprises forming a gate insulating layer on a side of the gate electrode away from the base substrate; and forming a capacitor electrode on a side of the gate insulating layer away from the gate electrode; wherein the gate electrode and the first metal layer are formed from a same material deposited in a same deposition process; the gate insulating layer and the first insulating layer are formed from a same material deposited in a same deposition process; and the capacitor electrode and the second metal layer are formed from a same material deposited in a same deposition process.

Optionally, forming the plurality of thin film transistor and forming the first separation pillar comprise forming a first conductive material layer on the base substrate throughout the display area and at least a portion of the peripheral area; patterning the first conductive material layer to form the gate electrode in the display area and a first metal precursor layer in the peripheral area; forming a first insulating material layer on a side of the gate electrode away from the base substrate, and throughout the display area and at least a portion of the peripheral area patterning the first insulating material layer in the display area to form the gate insulating layer in the display area and the first insulating layer in the peripheral area; forming a second conductive material layer on a side of the gate insulating layer away from the base substrate, and throughout the display area and at least a portion of the peripheral area; patterning the second conductive material layer to form the capacitor electrode in the display area and a second metal precursor layer in the peripheral area; forming a second insulating material layer on a side of the capacitor electrode away from the base substrate, and throughout the display area and at least a portion of the peripheral area; patterning the second insulating material layer to form an insulating layer in the display area and the second insulating layer in the peripheral area; and etching the first metal precursor layer and the second metal precursor layer from lateral sides of the first metal precursor layer and the second metal precursor layer, respectively, in a same etching process, to form the first metal layer and the second metal layer; wherein widths of the first metal precursor layer, the first insulating layer, the second metal precursor layer, and the second insulating layer, along the cross-pillar direction, are substantially the same; and orthographic projections of the first metal precursor layer, the first insulating layer, the second metal precursor layer, and the second insulating layer on the base substrate are substantially co-extensive and overlapping.

Optionally, the method further comprises forming an electrode material layer; and etching the electrode material layer to form an anode of a respective one of the plurality of light emitting elements in the display area; wherein etching the first metal precursor layer and the second metal precursor layer and etching the electrode material layer are performed in a same process and using a same etchant.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
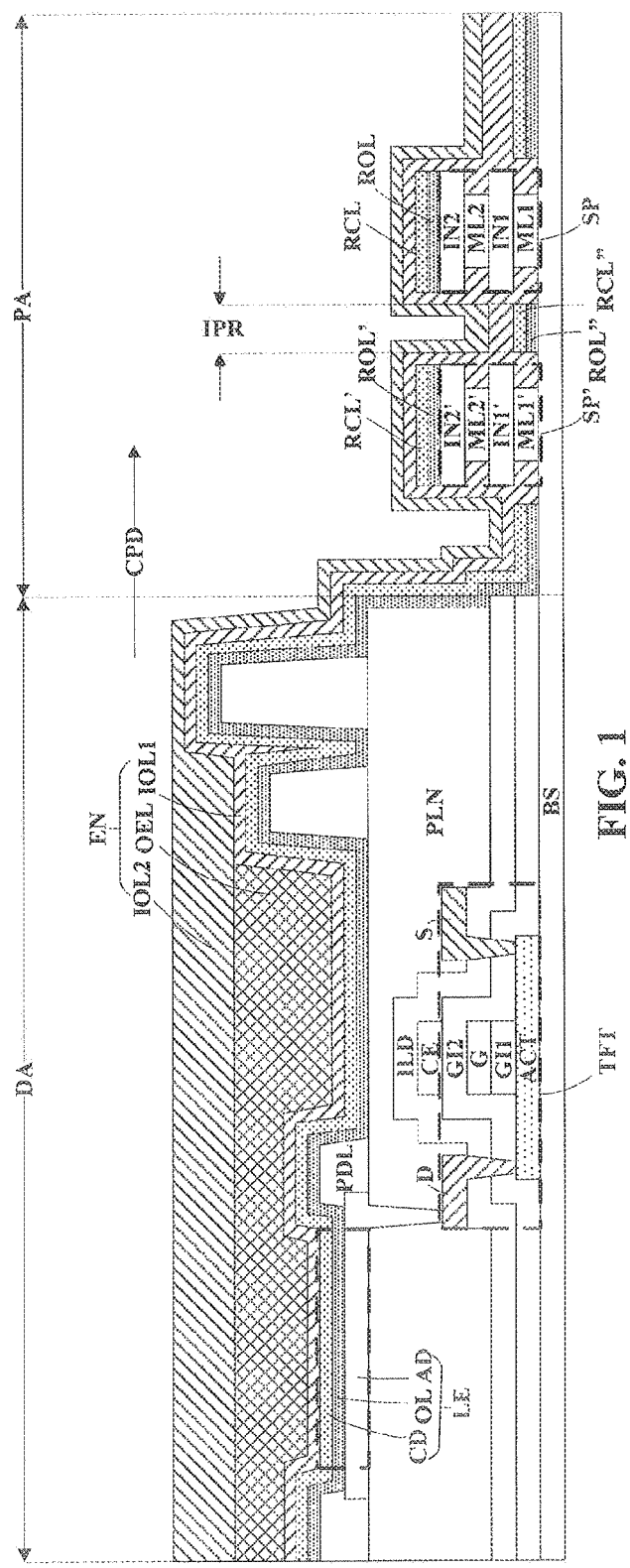
FIG. 1 is a cross-sectional view of a portion of a display substrate in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

It is discovered in the present disclosure that a display panel or a display substrate is particularly prone to moist and oxygen permeation in a window region formed to install an accessory such as a camera. The window region is typically formed by punching a hole through the display substrate. Thus, the encapsulating layer may not be able to encapsulate the display substrate once the window region is formed. Particularly, a fabrication process of an organic light emitting diode display substrate often adopts an open mask process to deposit one or more organic material layer and/or electrode layer, e.g., without any patterning steps. The encapsulating layer in the window region cannot satisfactorily encapsulate these organic material layer and electrode layer, leading to exposure of the display substrate to external oxygen and moist.

To better encapsulate the display substrate, the present disclosure uses one or more separation pillars in the peripheral area or in the window region. When depositing the organic material layer and/or electrode layer, the separation pillar isolates these layers into discontinued portions in the peripheral area or in the window region. In some embodiments, the present disclosure uses a three-layer metallic structure as the separation pillar. For example, the three-layer metallic structure may be formed in a same process using a same material as source electrodes and drain electrodes of a plurality of thin film transistors in the display substrate. In one specific example, the source electrodes and drain electrodes, and the three-layer metallic structure respectively include a titanium/aluminum/titanium three-layer structure.

It is further discovered in the present disclosure that the top metal layer of the multi-layer structure of the separation pillar is particularly prone to falling off the display substrate during the fabrication process. As a result, the separation pillar is incapable of isolating the organic material layer and/or electrode layer into discontinued portions in the peripheral area or in the window region. Moreover, a surface of the metallic material are largely exposed during the patterning process for forming the multi-layer structure. Residues produced in this process may be carried into the display area in a subsequent process, resulting in short circuit between components of light emitting elements, leading to display defects.

Accordingly, the present disclosure provides, inter alia, a display substrate, a display apparatus, and a method of fabricating a display substrate that substantially obviate one or more of the problems due to limitations and disadvantages of the related art. In one aspect, the present disclosure provides a display substrate having a display area and a peripheral area. In some embodiments, the display substrate includes a base substrate; a plurality of light emitting elements on the base substrate and in the display area; an encapsulating layer on a side of the plurality of light emitting elements away from the base substrate to encapsulate the plurality of light emitting elements; and a first separation pillar in the peripheral area and on the base substrate, the first separation pillar forming a first enclosure substantially surrounding a first area. Optionally, the first separation pillar includes a plurality of metal layers and a plurality of insulating layers alternately stacked on the base substrate. Optionally, a width of a respective one of the plurality of insulating layers along a cross-pillar direction across the first enclosure and from the display area toward the first separation pillar is greater than a width of a respective one of the plurality of metal layer along the cross-pillar direction.

As used herein, the term "display area" refers to an area of a display substrate (e.g., an opposing substrate or an array substrate) in a display panel where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display panel. An inter-subpixel region refers to a region between adjacent subpixel regions, such as a region corresponding to a black matrix in a liquid crystal display or a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels.

As used herein the term "peripheral area" refers to an area of a display substrate (e.g., an opposing substrate or an array substrate) in a display panel where various circuits and wires are provided to transmit signals to the display substrate. To increase the transparency of the display apparatus, non-transparent or opaque components of the display apparatus (e.g., battery, printed circuit board, metal frame), can be disposed in the peripheral area rather than in the display areas. In the context of the present disclosure, the peripheral area may include a window region.

As used herein the term "substantially surrounding" refers to surrounding at least 50% (e.g., at least 60%, at least 70%, at least 80%, at least 90%, at least 95%, at least 99%, and 100%) of a perimeter of an area.

Various appropriate light emitting elements may be used in the present display substrate. Examples of appropriate light emitting elements include organic light emitting diodes, quantum dots light emitting diodes, and micro light emitting diodes.

FIG. 1 is a cross-sectional view of a portion of a display substrate in some embodiments according to the present disclosure. Referring to FIG. 1, the display substrate in some embodiments includes a display area DA and a peripheral area PA. In some embodiments, the display substrate includes a base substrate BS; a plurality of light emitting elements LE on the base substrate BS and in the display area DA; an encapsulating layer EN on a side of the plurality of light emitting elements LE away from the base substrate BS to encapsulate the plurality of light emitting elements LE; and a first separation pillar SP in the peripheral area PA and on the base substrate BS. Optionally, the first separation pillar SP includes a plurality of metal layers and a plurality of insulating layers alternately stacked on the base substrate BS. Optionally, the display substrate further includes a second separation pillar SP' in the peripheral area PA and on the base substrate BS.

Figure 2A:
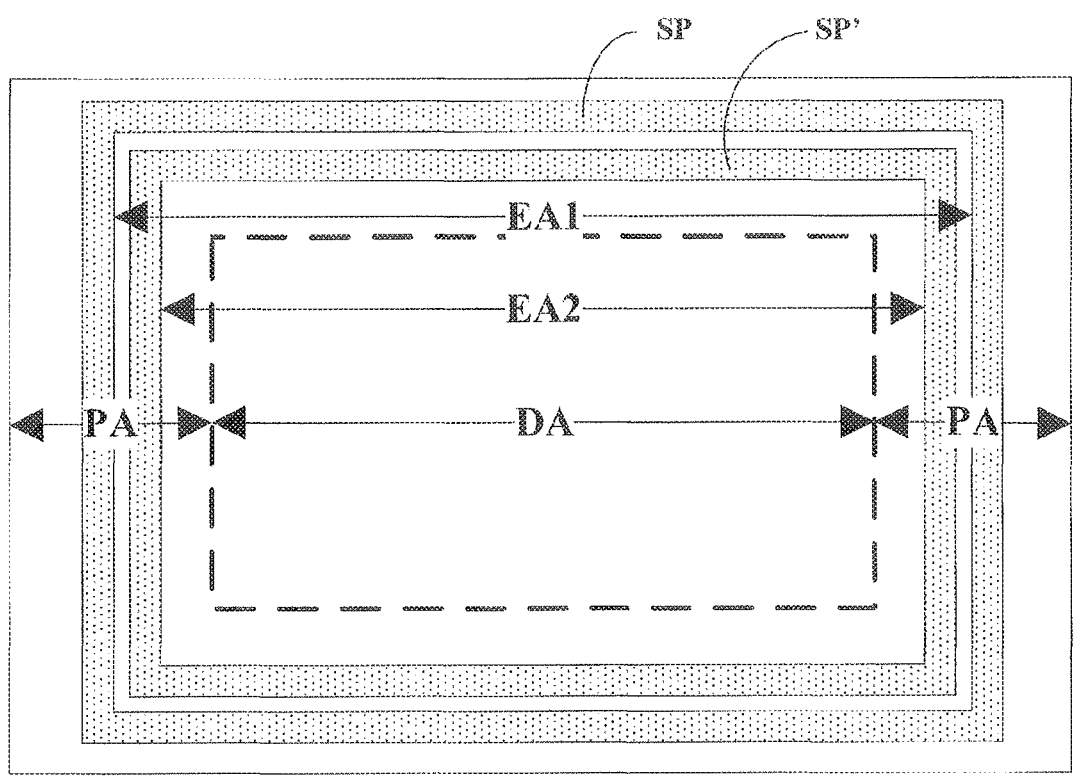
FIG. 2A is a plan view of a display substrate in some embodiments according to the present disclosure.

FIG. 2A is a plan view of a display substrate in some embodiments according to the present disclosure. Referring to FIG. 2A, the first separation pillar SP in the peripheral area PA forms a first enclosure substantially surrounding a first area EA1. Optionally, the first enclosure substantially surrounds the display area DA, and the first area EA1 has an area equal to or greater than an area of the display area DA. Optionally, the second separation pillar SP' in the peripheral area PA forms a second enclosure substantially surrounding a second area EA2. Optionally, the first area EA1 substantially encloses the second area EA2.

Figure 2B:
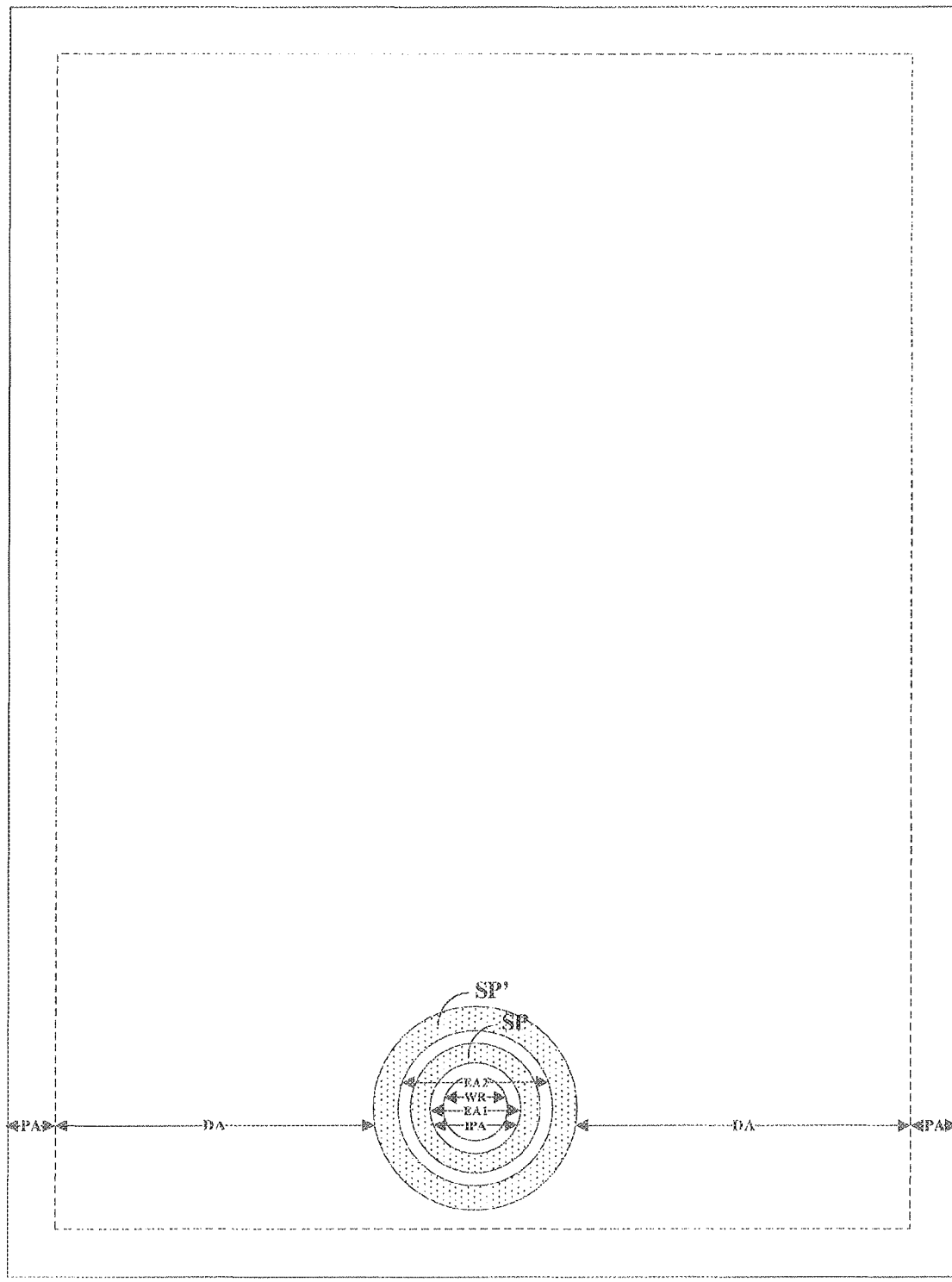
FIG. 2B is a plan view of a display substrate in some embodiments according to the present disclosure.

FIG. 2B is a plan view of a display substrate in some embodiments according to the present disclosure. Referring to FIG. 2B, the display substrate has a substantially rectangular shape. In some embodiments, the first separation pillar SP in the peripheral area PA forms a first enclosure substantially surrounding a first area EA1. The first enclosure does not surround the display area DA, but substantially surrounds an inner peripheral area IPA which is substantially surrounded by the display area DA. The inner peripheral area IPA has an area equal to or smaller than an area of the first area EA1. Optionally, the first enclosure substantially surrounds a window region WR of the display substrate, the display substrate has an aperture extending through the window region WR for installing an accessory (e.g., a camera lens, a fingerprint sensor) therein. Optionally, the first area EA1 has an area equal to or greater than an area of the window region WR. Optionally, the second separation pillar SP' forms a second enclosure substantially surrounding a second area EA2. Optionally, the second area EA2 substantially encloses the first area EA1.

Figure 2C:
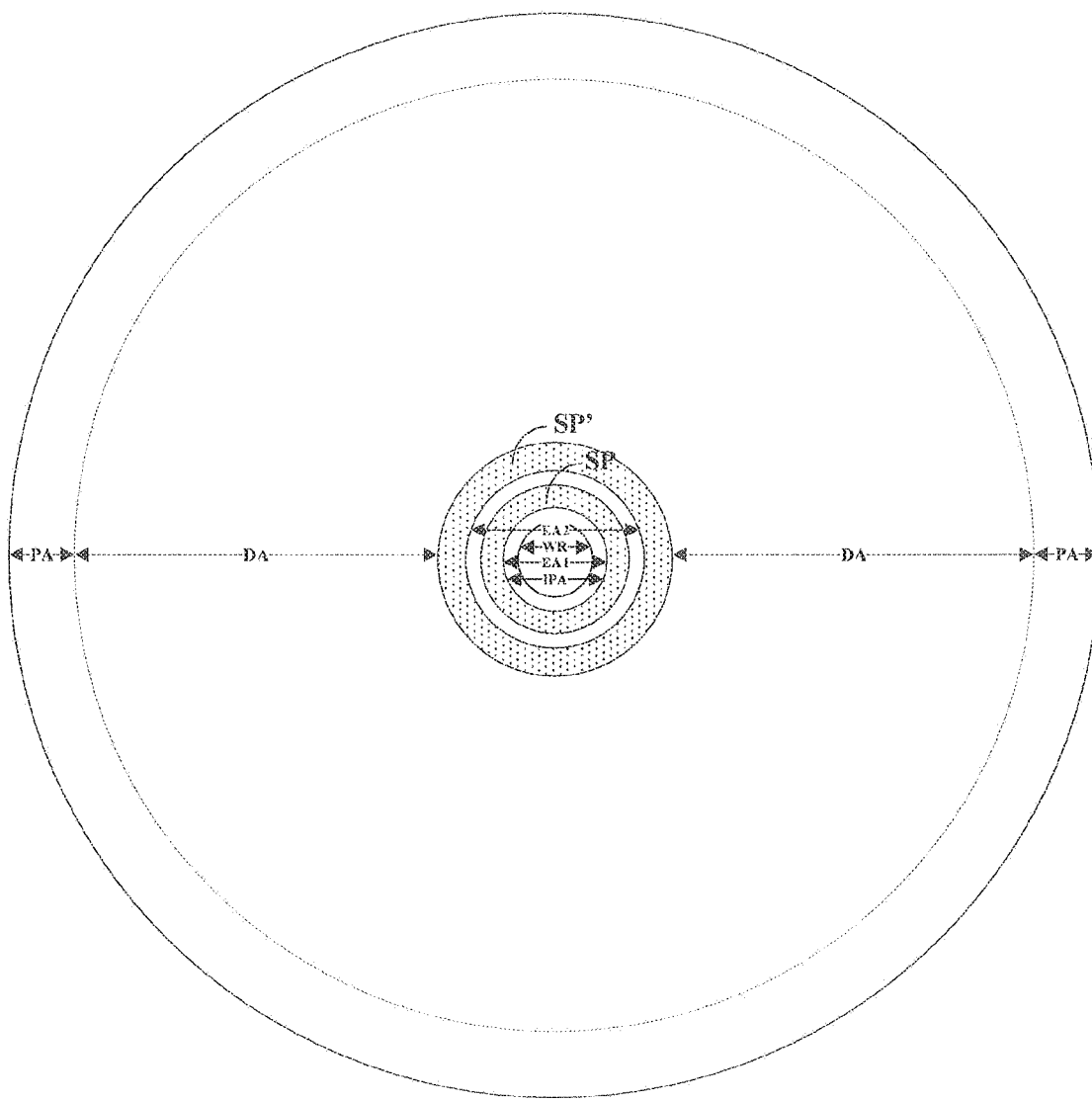
FIG. 2C is a plan view of a display substrate in some embodiments according to the present disclosure.

FIG. 2C is a plan view of a display substrate in some embodiments according to the present disclosure. Referring to FIG. 2C, the display substrate has a substantially circular shape. In some embodiments, the first separation pillar SP forms a first enclosure substantially surrounding a first area EA1. The first enclosure does not surround the display area DA, but substantially surrounds an inner peripheral area IPA which is substantially surrounded by the display area DA. The inner peripheral area IPA has an area equal to or smaller than an area of the first area EA1. Optionally, the first enclosure substantially surrounds a window region WR of the display substrate, the display substrate has an aperture extending through the window region WR for installing an accessory (e.g., a camera lens, a fingerprint sensor) therein. Optionally, the first area EA1 has an area equal to or greater than an area of the window region WR. Optionally, the second separation pillar SP' forms a second enclosure substantially surrounding a second area EA2. Optionally, the second area EA2 substantially encloses the first area EA1.

Figure 3A:
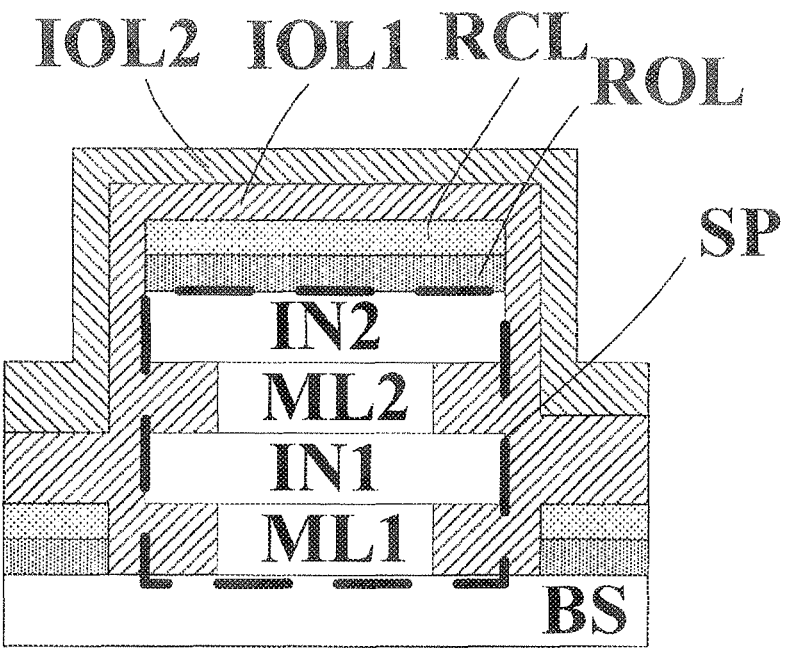
FIG. 3A and FIG. 3B are zoom-in views of a portion of a display substrate around a first separation pillar in some embodiments according to the present disclosure.
Figure 3B:
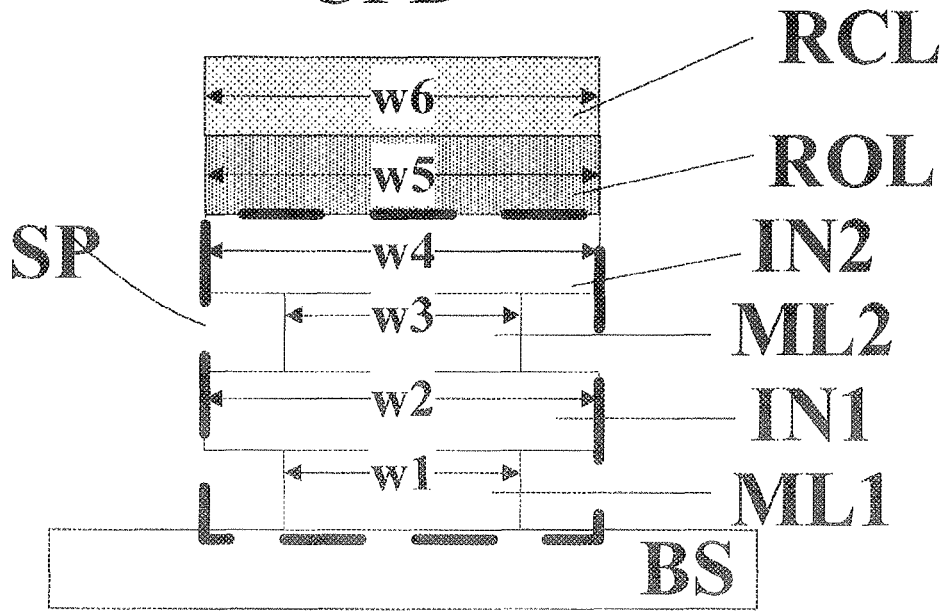

FIG. 3A and FIG. 3B are zoom-in views of a portion of a display substrate around a first separation pillar in some embodiments according to the present disclosure. Referring to FIG. 1 and FIG. 3A, in some embodiments, the first separation pillar SP includes a plurality of metal layers and a plurality of insulating layers alternately stacked on the base substrate BS. As shown in FIG. 3A, the first separation pillar SP includes a first metal layer ML1 on the base substrate BS, a first insulating layer IN1 on a side of the first metal layer ML1 away from the base substrate BS, a second metal layer ML2 on a side of the first insulating layer IN1 away from the first metal layer ML1; and a second insulating layer IN2 on a side of the second metal layer ML2 away from the first insulating layer IN1. In some embodiments, at least one (e.g., each) of the plurality of insulating layers of the first separation pillar SP is in direct contact with one or more adjacent metal layers of the plurality of metal layers of the first separation pillar SP, and at least one (e.g., each) of the plurality of metal layers of the first separation pillar SP is in direct contact with one or more adjacent insulating layers of the plurality of insulating layers of the first separation pillar SP. Referring to FIG. 1 and FIG. 3A, in some embodiments, the first insulating layer IN1 is in direct contact with the first metal layer ML1 on one side and in direct contact with the second metal layer ML2 on another side; and the second metal layer ML2 is in direct contact with the first insulating layer IN1 on one side and in direct contact with the second insulating layer IN2 on another side.

In some embodiments, a width of a respective one of the plurality of insulating layers along a cross-pillar direction CPD across the first enclosure and from the display area DA toward the first separation pillar SP is greater than a width of a respective one of the plurality of metal layer along the cross-pillar direction CPD. Referring to FIG. 1, FIG. 3A and FIG. 3B, along the cross-pillar direction CPD, the first metal layer ML1 has a width w1, the first insulating layer IN1 has a width w2, the second metal layer ML2 has a width w3, and the second insulating layer IN2 has a width w4. Optionally, w1 is smaller than w2. Optionally, w1 smaller than w4. Optionally, w3 is smaller than w4. Optionally, w3 smaller than w2. Optionally, w2 is greater than w1 by at least 10%, e.g., by at least 20%, by at least 30%, by at least 40%, or by at least 50%. Optionally, w4 is greater than w1 by at least 10%, e.g., by at least 20%, by at least 30%, by at least 40%, or by at least 50%. Optionally, w4 is greater than w3 by at least 10%, e.g., by at least 20%, by at least 30%, by at least 40%, or by at least 50%. Optionally, w2 is greater than w3 by at least 10%, e.g., by at least 20%, by at least 30%, by at least 40%, or by at least 50%.

Optionally, w1 and w3 are substantially the same. Optionally, w2 and w4 are substantially the same. As used herein, the term "substantially the same" refers to a difference between two values not exceeding 10% of a base value (e.g., one of the two values), e.g., not exceeding 8%, not exceeding 6%, not exceeding 4%, not exceeding 2%, not exceeding 1%, not exceeding 0.5%, not exceeding 0.1%, not exceeding 0.05%, and not exceeding 0.01%, of the base value.

Figure 3C:
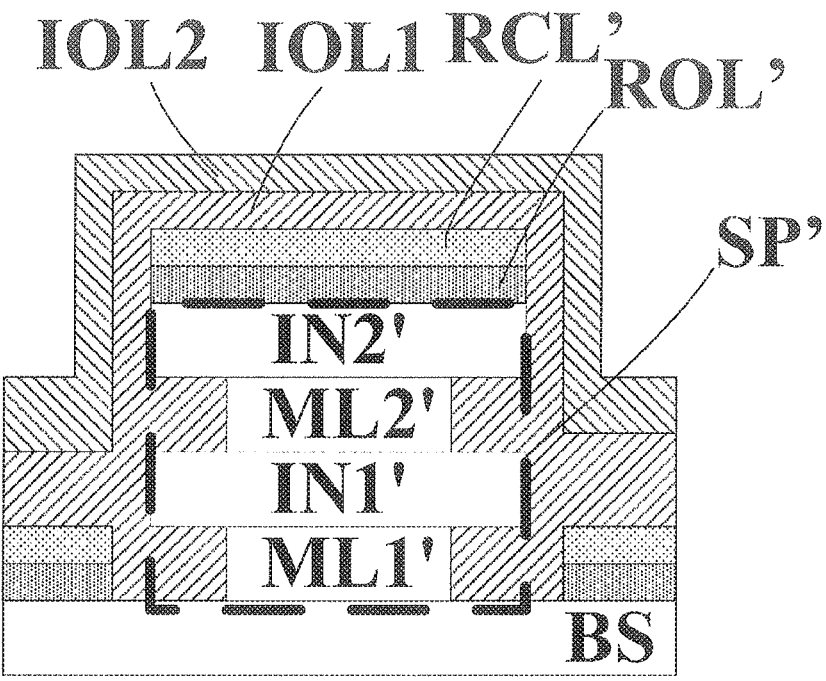
FIG. 3C and FIG. 3D are zoom-in views of a portion of a display substrate around a second separation pillar in some embodiments according to the present disclosure.
Figure 3D:
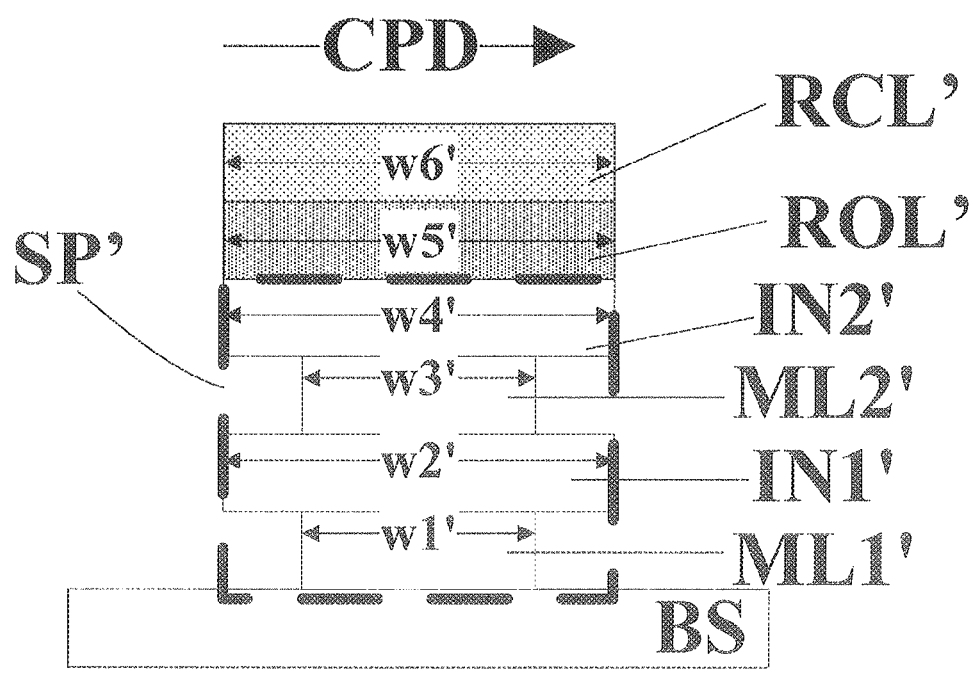

FIG. 3C and FIG. 3D are zoom-in views of a portion of a display substrate around a second separation pillar in some embodiments according to the present disclosure. Referring to FIG. 1 and FIG. 3C, in some embodiments, the second separation pillar SP' includes a plurality of metal layers and a plurality of insulating layers alternately stacked on the base substrate BS. As shown in FIG. 3C, the second separation pillar SP' includes a third metal layer ML1' on the base substrate BS, a third insulating layer IN1' on a side of the third metal layer ML1' away from the base substrate BS, a fourth metal layer ML2' on a side of the third insulating layer IN1' away from the third metal layer ML1'; and a fourth insulating layer IN2' on a side of the fourth metal layer ML2' away from the third insulating layer IN1'. In some embodiments, at least one (e.g., each) of the plurality of insulating layers of the second separation pillar SP' is in direct contact with one or more adjacent metal layers of the plurality of metal layers of the second separation pillar SP', and at least one (e.g., each) of the plurality of metal layers of the second separation pillar SP' is in direct contact with one or more adjacent insulating layers of the plurality of insulating layers of the second separation pillar SP'. Referring to FIG. 1 and FIG. 3C, in some embodiments, the third insulating layer IN1' is in direct contact with the third metal layer ML1' on one side and in direct contact with the fourth metal layer ML2' on another side; and the fourth metal layer ML2' is in direct contact with the third insulating layer IN1' on one side and in direct contact with the fourth insulating layer IN2' on another side.

In some embodiments, a width of a respective one of the plurality of insulating layers along the cross-pillar direction CPD is greater than a width of a respective one of the plurality of metal layer along the cross-pillar direction CPD. Referring to FIG. 1, FIG. 3C and FIG. 3D, along the cross-pillar direction CPD, the third metal layer ML1' has a width w1', the third insulating layer IN1' has a width w2', the fourth metal layer ML2' has a width w3', and the fourth insulating layer IN2' has a width w4'. Optionally, w1' is smaller than w2'. Optionally, w1' smaller than w4'. Optionally, w3' is smaller than w4'. Optionally, w3' smaller than w2'. Optionally, w2' is greater than w1' by at least 10%, e.g., by at least 20%, by at least 30%, by at least 40%, or by at least 50%. Optionally, w4' is greater than w1' by at least 10%, e.g., by at least 20%, by at least 30%, by at least 40%, or by at least 50%. Optionally, w4' is greater than w3' by at least 10%, e.g., by at least 20%, by at least 30%, by at least 40%, or by at least 50%. Optionally, w2' is greater than w3' by at least 10%, e.g., by at least 20%, by at least 30%, by at least 40%, or by at least 50%. Optionally, w1' and w3' are substantially the same. Optionally, w2' and w4' are substantially the same.

Referring to FIG. 1, in some embodiments, a respective one of the plurality of light emitting elements LE includes an anode layer AD, an organic functional layer OL on the anode layer AD, and a cathode layer CD on a side of the organic functional layer OL away from the base substrate BS. Optionally, the organic functional layer OL and the cathode layer CD can be formed in an open mask process. Optionally, the organic functional layer OL extends substantially throughout the display area DA as a unitary layer. Optionally, the cathode layer CD extends substantially throughout the display area DA as a unitary layer.

In some embodiments, the organic functional layer OL includes an organic light emitting layer. Optionally, the organic functional layer OL is selected from a group consisting of a hole transport layer, a hole injection layer, an electron transport layer, an electron injection layer, or any other organic functional layer in the respective one of the plurality of light emitting element LE.

Due to the presence of the separation pillar(s), in the process of depositing an organic material in the open mask process, the organic material layer deposited on the base substrate BS is isolated into the organic functional layer OL extending substantially throughout the display area DA as a unitary layer, and a first residual organic functional layer ROL in the peripheral area PA and on a side of the first separation pillar SP away from the base substrate BS. Referring to FIG. 1, the first residual organic functional layer ROL and the organic functional layer OL are in a same layer and includes a same material (formed in a same open mask deposition process). The first residual organic functional layer ROL is isolated from the organic functional layer OL by a lateral side of the first separation pillar SP.

In some embodiments, a width of the first residual organic functional layer ROL along the cross-pillar direction CPD is greater than the width of the respective one of the plurality of metal layers along the cross-pillar direction CPD. Referring to FIG. 3B, along the cross-pillar direction CPD, the first residual organic functional layer ROL has a width w5. Optionally, w1 is smaller than w5. Optionally, w3 smaller than w5. Optionally, w5 is greater than w1 by at least 10%, e.g., by at least 20%, by at least 30%, by at least 40%, or by at least 50%. Optionally, w5 is greater than w3 by at least 10%, e.g., by at least 20%, by at least 30%, by at least 40%, or by at least 50%. Optionally, w5 and w2 are substantially the same. Optionally, w5 and w4 are substantially the same.

Similarly, referring to FIGS. 1, 3A to 3D, due to the presence of the second separation pillar SP', the organic material layer deposited on the base substrate BS is isolated into the organic functional layer OL extending substantially throughout the display area DA as a unitary layer, a first residual organic functional layer ROL in the peripheral area PA and on a side of the first separation pillar SP away from the base substrate BS, and a second residual organic functional layer ROL' in the peripheral area PA and on a side of the second separation pillar SP' away from the base substrate BS. The first residual organic functional layer ROL, the second residual organic functional layer ROL', and the organic functional layer OL are in a same layer and includes a same material (formed in a same open mask deposition process). The first residual organic functional layer ROL is isolated from the organic functional layer OL by a lateral side of the first separation pillar SP. The second residual organic functional layer ROL' is isolated from the organic functional layer OL by a lateral side of the second separation pillar SP'.

In some embodiments, a width of the second residual organic functional layer ROL' along the cross-pillar direction CPD is greater than the width of the respective one of the plurality of metal layers along the cross-pillar direction CPD. Referring to FIG. 3D, along the cross-pillar direction CPD, the second residual organic functional layer ROL' has a width w5'. Optionally, w1' is smaller than w5'. Optionally, w3' smaller than w5'. Optionally, w5' is greater than w1' by at least 10%. e.g., by at least 20%, by at least 30%, by at least 40%, or by at least 50%. Optionally, w5' is greater than w3' by at least 10%, e.g., by at least 20%, by at least 30%, by at least 40%, or by at least 50%. Optionally, w5' and w2' are substantially the same. Optionally, w5' and w4' are substantially the same.

Due to the presence of the separation pillar(s), in the process of depositing an electrode material in the open mask process, the electrode material layer deposited on the base substrate BS is isolated into the cathode layer CD extending substantially throughout the display area DA as a unitary layer, and a first residual cathode layer RCL in the peripheral area PA and on a side of the first separation pillar SP away from the base substrate BS (optionally, on a side of the first residual organic functional layer ROL away from the first separation pillar SP). Referring to FIG. 1, the first residual cathode layer RCL and the cathode layer CD are in a same layer and includes a same material (formed in a same open mask deposition process). The first residual cathode layer RCL is isolated from the cathode layer CD by a lateral side of the first separation pillar SP.

In some embodiments, a width of the first residual cathode layer RCL along the cross-pillar direction CPD is greater than the width of the respective one of the plurality of metal layer along the cross-pillar direction CPD. Referring to FIG. 3B, along the cross-pillar direction CPD, the first residual cathode layer RCL has a width w6. Optionally, w1 is smaller than w6. Optionally, w3 smaller than w6. Optionally, w6 is greater than w1 by at least 10%. e.g., by at least 20%, by at least 30%, by at least 40%, or by at least 50%. Optionally, w6 is greater than w3 by at least 10%, e.g., by at least 20%, by at least 30%, by at least 40%, or by at least 50%. Optionally, w6 and w2 are substantially the same. Optionally, w6 and w4 are substantially the same. Optionally, w6 and w5 are substantially the same.

Similarly, referring to FIGS. 1, 3A to 3D, due to the presence of the second separation pillar SP', the electrode material layer deposited on the base substrate BS is isolated into the cathode layer CD extending substantially throughout the display area DA as a unitary layer, a first residual cathode layer RCL in the peripheral area PA and on a side of the first separation pillar SP away from the base substrate BS (optionally, on a side of the first residual organic functional layer ROL away from the first separation pillar SP), and a second residual cathode layer RCL' in the peripheral area PA and on a side of the second separation pillar SP' away from the base substrate BS (optionally, on a side of the second residual organic functional layer ROL' away from the second separation pillar SP'). The first residual cathode layer RCL, the second residual cathode layer RCL', and the cathode layer CD are in a same layer and includes a same material (formed in a same open mask deposition process). The first residual cathode layer RCL is isolated from the cathode layer CD by a lateral side of the first separation pillar SP. The second residual cathode layer RCL' is isolated from the cathode layer CD by a lateral side of the second separation pillar SP'.

In some embodiments, a width of the second residual cathode layer RCL' along the cross-pillar direction CPD is greater than the width of the respective one of the plurality of metal layer along the cross-pillar direction CPD. Referring to FIG. 3D, along the cross-pillar direction CPD, the second residual cathode layer RCL' has a width w6'. Optionally, w1' is smaller than w6'. Optionally, w3' smaller than w6'. Optionally, w6' is greater than w1' by at least 10%, e.g., by at least 20%, by at least 30%, by at least 40%, or by at least 50%. Optionally, w6' is greater than w3' by at least 10%, e.g., by at least 20%, by at least 30%, by at least 40%, or by at least 50%. Optionally, w6' and w2' are substantially the same. Optionally, w6' and w4' are substantially the same. Optionally, w6' and w5' are substantially the same.

Figure 4A:
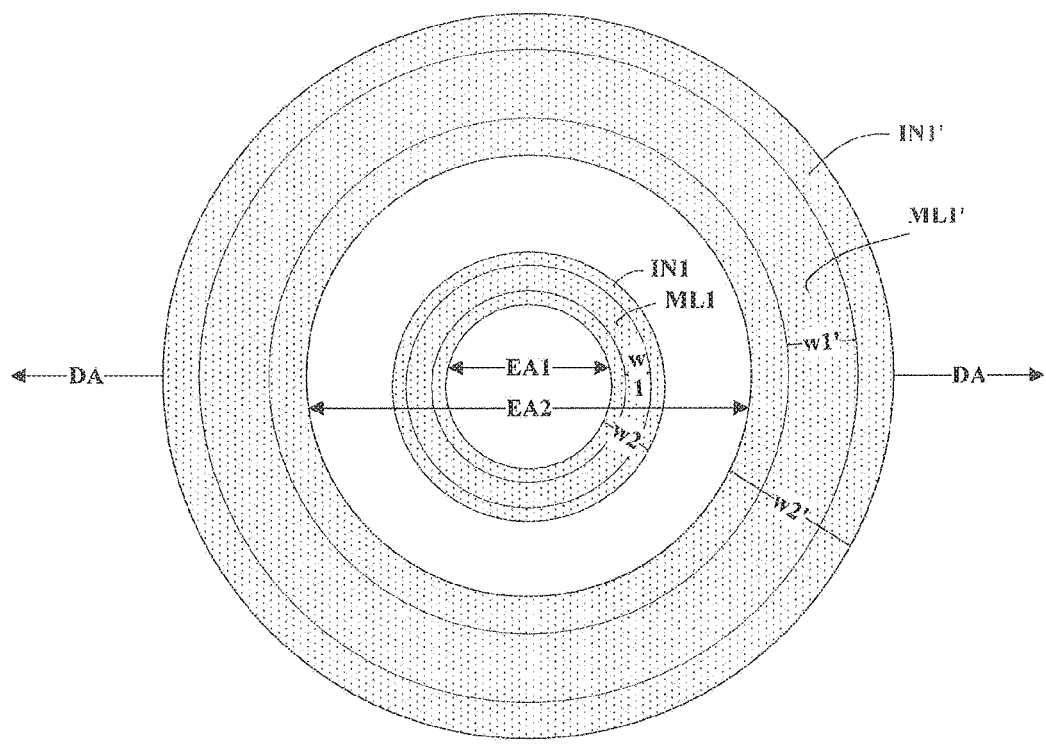
FIG. 4A is a plan view of a first insulating layer and a first metal layer of a first separation pillar, and a third insulating layer and a third metal layer of a second separation pillar in some embodiments according to the present disclosure.
Figure 4B:
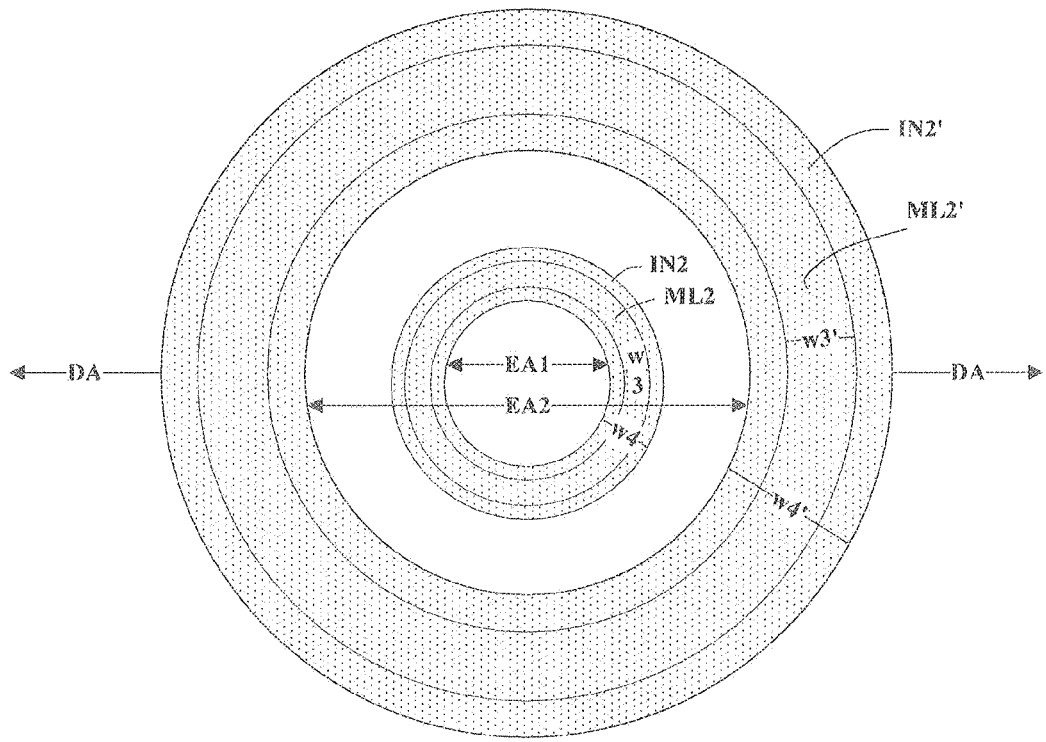
FIG. 4B is a plan view of a second insulating layer and a second metal layer of a first separation pillar, and a fourth insulating layer and a fourth metal layer of a second separation pillar in some embodiments according to the present disclosure.

In some embodiments, an orthographic projection of the respective one of the plurality of insulating layers of the first separation pillar SP on the base substrate is larger than and covers an orthographic projection of the respective one of the plurality of metal layers of the first separation pillar SP on the base substrate. Optionally, an orthographic projection of the respective one of the plurality of insulating layers of the second separation pillar SP' on the base substrate is larger than and covers an orthographic projection of the respective one of the plurality of metal layers of the second separation pillar SP' on the base substrate. FIG. 4A is a plan view of a first insulating layer and a first metal layer of a first separation pillar, and a third insulating layer and a third metal layer of a second separation pillar in some embodiments according to the present disclosure. Referring to FIG. 4A, FIG. 3A, and FIG. 3C, an orthographic projection of the first insulating layer IN1 on the base substrate BS is larger than and covers an orthographic projection of the first metal layer ML1 on the base substrate BS, and an orthographic projection of the third insulating layer IN1' on the base substrate BS is larger than and covers an orthographic projection of the third metal layer ML1' on the base substrate BS. FIG. 4B is a plan view of a second insulating layer and a second metal layer of a first separation pillar, and a fourth insulating layer and a fourth metal layer of a second separation pillar in some embodiments according to the present disclosure. Referring to FIG. 4B, FIG. 3A, and FIG. 3C, an orthographic projection of the second insulating layer IN2 on the base substrate BS is larger than and covers an orthographic projection of the second metal layer ML2 on the base substrate BS, and an orthographic projection of the fourth insulating layer IN2' on the base substrate BS is larger than and covers an orthographic projection of the fourth metal layer ML2' on the base substrate BS.

Similarly, referring to FIG. 3A and FIG. 3C, in some embodiments, an orthographic projection of the second insulating layer IN2 on the base substrate BS is larger than and covers an orthographic projection of the first metal layer ML1 on the base substrate BS, an orthographic projection of the fourth insulating layer IN2' on the base substrate BS is larger than and covers an orthographic projection of the third metal layer ML1' on the base substrate BS, an orthographic projection of the first insulating layer IN1 on the base substrate BS is larger than and covers an orthographic projection of the second metal layer ML2 on the base substrate BS, and an orthographic projection of the third insulating layer IN1' on the base substrate BS is larger than and covers an orthographic projection of the fourth metal layer ML2' on the base substrate BS.

Figure 4C:
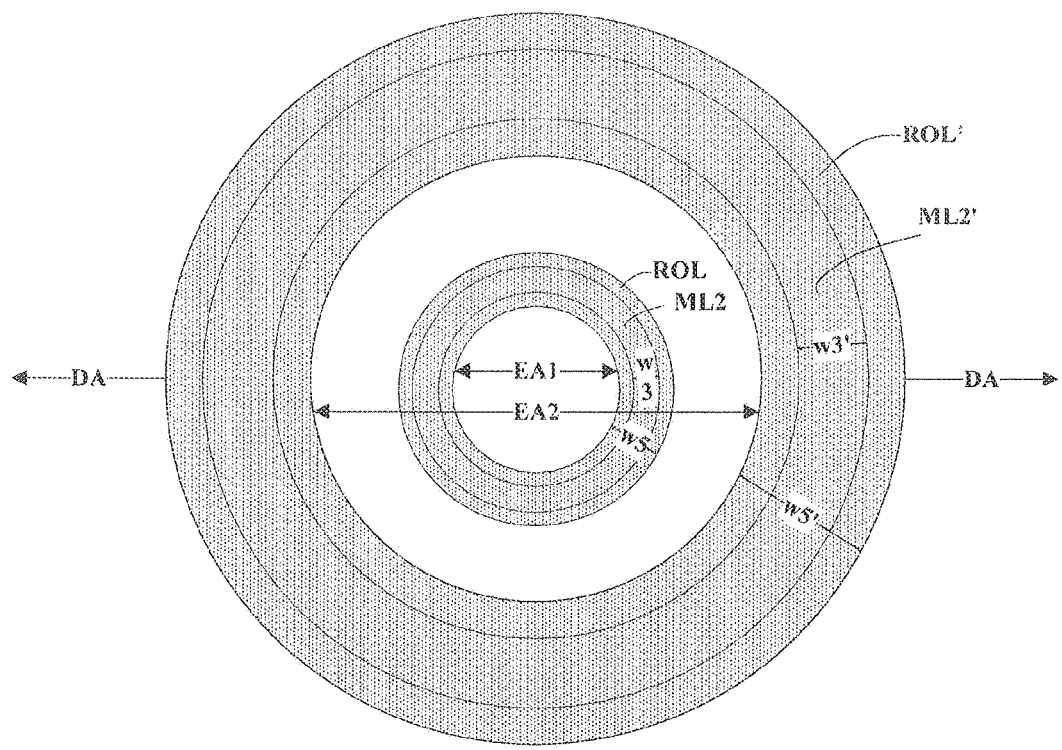
FIG. 4C is a plan view of a residual organic functional layer and a second metal layer of a first separation pillar, and a second residual organic functional layer and a fourth metal layer of a second separation pillar in some embodiments according to the present disclosure.

In some embodiments, an orthographic projection of the residual organic functional layer on the base substrate is larger than and covers an orthographic projection of the respective one of the plurality of metal layers on the base substrate. FIG. 4C is a plan view of a first residual organic functional layer and a second metal layer of a first separation pillar, and a second residual organic functional layer and a fourth metal layer of a second separation pillar in some embodiments according to the present disclosure. Referring to FIG. 4C, FIG. 3A, and FIG. 3C, an orthographic projection of the first residual organic functional layer ROL on the base substrate BS is larger than and covers an orthographic projection of the second metal layer ML2 on the base substrate BS, and an orthographic projection of the second residual organic functional layer ROL' on the base substrate BS is larger than and covers an orthographic projection of the fourth metal layer ML2' on the base substrate BS.

Similarly, referring to FIG. 3A and FIG. 3C, in some embodiments, an orthographic projection of the first residual organic functional layer ROL on the base substrate BS is larger than and covers an orthographic projection of the first metal layer ML1 on the base substrate BS, and an orthographic projection of the second residual organic functional layer ROL' on the base substrate BS is larger than and covers an orthographic projection of the third metal layer ML1' on the base substrate BS.

Figure 4D:
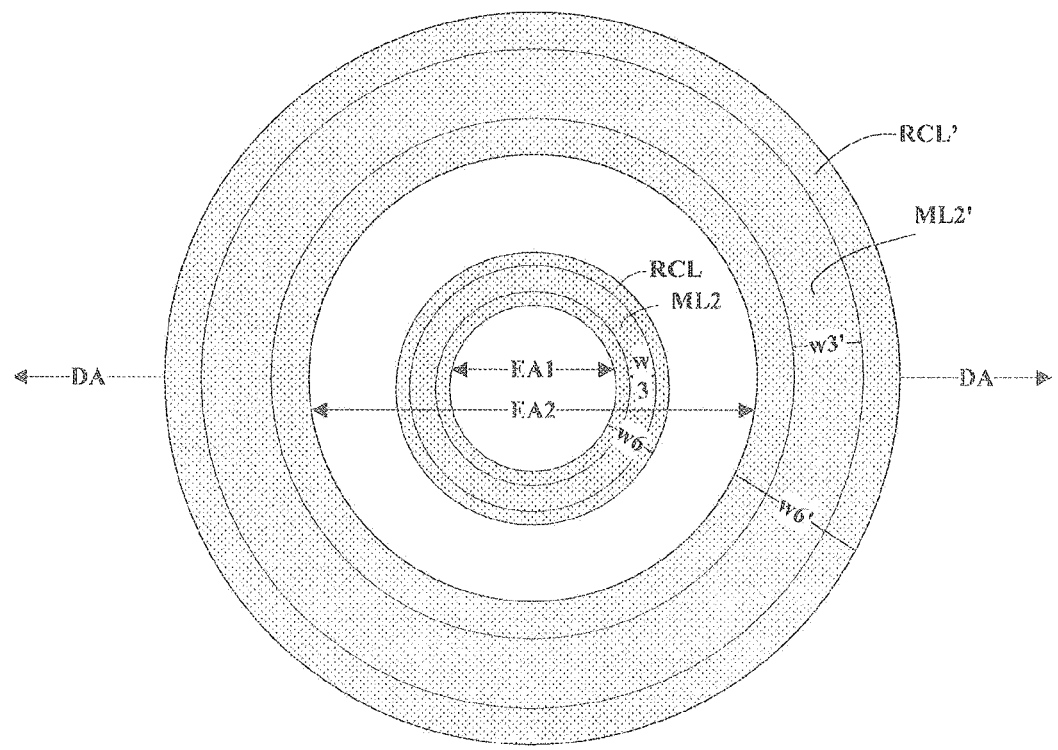
FIG. 4D is a plan view of a residual cathode layer and a second metal layer of a first separation pillar, and a second residual cathode layer and a fourth metal layer of a second separation pillar in some embodiments according to the present disclosure.

In some embodiments, an orthographic projection of the residual cathode layer on the base substrate is larger than and covers an orthographic projection of the respective one of the plurality of metal layers on the base substrate. FIG. 4D is a plan view of a first residual cathode layer and a second metal layer of a first separation pillar, and a second residual cathode layer and a fourth metal layer of a second separation pillar in some embodiments according to the present disclosure. Referring to FIG. 4D, FIG. 3A, and FIG. 3C, an orthographic projection of the first residual cathode layer RCL on the base substrate BS is larger than and covers an orthographic projection of the second metal layer ML2 on the base substrate BS, and an orthographic projection of the second residual cathode layer RCL' on the base substrate BS is larger than and covers an orthographic projection of the fourth metal layer ML2' on the base substrate BS.

Similarly, referring to FIG. 3A and FIG. 3C, in some embodiments, an orthographic projection of the first residual cathode layer RCL on the base substrate BS is larger than and covers an orthographic projection of the first metal layer ML1 on the base substrate BS, and an orthographic projection of the second residual cathode layer RCL' on the base substrate BS is larger than and covers an orthographic projection of the third metal layer ML1' on the base substrate BS.

In some embodiments, referring to FIG. 1, the display substrate further includes a plurality of thin film transistors TFT for driving light emission of the plurality of light emitting elements LE. In some embodiments, a respective one of the plurality of thin film transistors TFT includes an active layer ACT on the base substrate BS, a gate electrode G, a first gate insulating layer GI1 between the gate electrode G and the active layer ACT, and a source electrode S and a drain electrode D respectively connected to the active layer ACT. The drain electrode D of the respective one of the plurality of thin film transistors TFT is electrically connected to the anode layer AD of a respective one of the plurality of light emitting elements LE.

Various appropriate conductive electrode materials and various appropriate fabricating methods may be used to make the gate electrode G. For example, a conductive electrode material may be deposited on the substrate by, e.g., sputtering or vapor deposition, and patterned by, e.g., lithography such as a wet etching process to form a gate electrode layer. Examples of appropriate conductive electrode materials include, but are not limited to, aluminum, chromium, tungsten, titanium, tantalum, molybdenum, copper, and alloys or laminates containing the same. Optionally, the gate electrode G includes molybdenum.

In some embodiments, the display substrate further includes a second gate insulating layer GI2 on a side of the gate electrode G away from the base substrate BS; and a capacitor electrode CE on a side of the second gate insulating layer GI2 away from the gate electrode G. Optionally, the capacitor electrode CE is one of the electrodes of a storage capacitor in a pixel driving circuit of the display substrate. In one example, the capacitor electrode CE forms a storage capacitance with a gate electrode of a driving thin film transistor in the pixel driving circuit of the display substrate.

Various appropriate insulating materials and various appropriate fabricating methods may be used to make the first gate insulating layer GI1 and the second gate insulating layer GI2. For example, an insulating material may be deposited on the substrate by a plasma-enhanced chemical vapor deposition process. Examples of materials suitable for making the first gate insulating layer GI1 and the second gate insulating layer GI2 include, but are not limited to, silicon oxide (SiOy), silicon nitride (SiNy, e.g., $Si_3N_4$), silicon oxynitride ($SiO_xN_y$). Optionally, the first gate insulating layer GI1 or the second gate insulating layer GI2 may have a single-layer structure or a stacked-layer structure including two or more sub-layers (e.g., a stacked-layer structure including a silicon oxide sublayer and a silicon nitride sublayer).

Various appropriate conductive electrode materials and various appropriate fabricating methods may be used to make the capacitor electrode CE. For example, a conductive electrode material may be deposited on the substrate by, e.g., sputtering or vapor deposition, and patterned by, e.g., lithography such as a wet etching process to form a gate electrode layer. Examples of appropriate conductive electrode materials include, but are not limited to, aluminum, chromium, tungsten, titanium, tantalum, molybdenum, copper, and alloys or laminates containing the same. Optionally, the capacitor electrode CE includes molybdenum.

In some embodiments, the display substrate further includes an inter-layer dielectric layer ILD on a side of the capacitor electrode CE and the second gate insulating layer GI2 away from the base substrate BS. As shown in FIG. 1, the source electrode S and the drain electrode D in some embodiments respectively extend through the inter-layer dielectric layer ILD and the second gate insulating layer GI2 to connect to the active layer ACT.

Various appropriate insulating materials and various appropriate fabricating methods may be used to make the inter-layer dielectric layer ILD. For example, an insulating material may be deposited on the substrate by a plasma-enhanced chemical vapor deposition process. Examples of materials suitable for making the inter-layer dielectric layer ILD include, but are not limited to, silicon oxide (SiOy), silicon nitride (SiNy, e.g., $Si_3N_4$), silicon oxynitride ($SiO_xN_y$).

In some embodiments, the display substrate further includes a planarization layer PLN on a side of the inter-layer dielectric layer ILD away from the base substrate BS. As shown in FIG. 1, the anode layer AD of the respective one of the plurality of light emitting elements LE extends through the planarization layer PLN to connect to the drain electrode D of the respective one of the plurality of thin film transistors TFT.

Various appropriate insulating materials and various appropriate fabricating methods may be used for making the planarization layer PLN. For example, an insulating material may be deposited on the substrate by a plasma-enhanced chemical vapor deposition process. Examples of appropriate insulating materials for making the planarization layer PLN includes, but are not limited to, silicon oxide (SiOy), silicon nitride (SiNy, e.g., $Si_3N_4$), silicon oxynitride ($SiO_xN_y$), polyimide, and an organic photoresist material.

In some embodiments, the display substrate further includes a pixel definition layer PDL for defining a plurality of subpixel apertures. The organic functional layer OL of a respective one of the plurality of light emitting elements LE is at least partially in a respective one of the plurality of subpixel apertures.

In some embodiments, the display substrate further includes an encapsulating layer EN on a side of the plurality of light emitting elements LE away from the base substrate BS to encapsulate the plurality of light emitting elements LE. Optionally, the encapsulating layer EN includes a first inorganic encapsulating sub-layer IOL1 on a side of the cathode layer CD away from the base substrate BS, an organic encapsulating sub-layer OEL on a side of the first inorganic encapsulating sub-layer IOL1 away from the base substrate BS, and a second inorganic encapsulating sub-layer IOL2 on a side of the organic encapsulating sub-layer OEL away from the base substrate BS.

Referring to FIG. 1 and FIG. 3A, in some embodiments, the first inorganic encapsulating sub-layer IOL1 and the second inorganic encapsulating sub-layer IOL2 extend from the display area DA into the peripheral area PA. In the peripheral area PA, the first inorganic encapsulating sub-layer IOL1 is on a side of the first residual cathode layer RCL away from the base substrate BS, and the second inorganic encapsulating sub-layer IOL2 is on a side of the first inorganic encapsulating sub-layer IOL1 away from the base substrate BS.

Referring to FIG. 1 and FIG. 3C, in some embodiments, in the peripheral area PA, the first inorganic encapsulating sub-layer IOL1 is on a side of the second residual cathode layer RCL' away from the base substrate BS, and the second inorganic encapsulating sub-layer IOL2 is on a side of the first inorganic encapsulating sub-layer IOL1 away from the base substrate BS.

Referring to FIG. 1, in an inter-pillar region IPR, the display substrate in some embodiments further includes one or a combination of (1) a third residual organic functional layer ROL", and (2) a third residual cathode layer RCL". Optionally, the display substrate in the inter-pillar region IPR includes the third residual organic functional layer ROL" on the base substrate BS, and the third residual cathode layer RCL" on a side of the third residual organic functional layer ROL" away from the base substrate BS.

In some embodiments, layers of the separation pillar(s) may be formed in a same patterning step as a layer in the display area DA. In some embodiments, the gate electrode G and the first metal layer ML1 are in a same layer and include a same material. Optionally, the gate electrode G, the first metal layer ML1, and the third metal layer ML1' are in a same layer and comprise a same material. As used herein, the term "same layer" refers to the relationship between the layers simultaneously formed in the same step. In one example, the gate electrode G, the first metal layer ML1, and the third metal layer ML1' are in a same layer when they are formed as a result of one or more steps of a same patterning process performed in a same layer of material. In another example, the gate electrode G, the first metal layer ML1, and the third metal layer ML1' can be formed in a same layer by simultaneously performing the step of forming the gate electrode G, the step of forming the first metal layer ML1, and the step of forming the third metal layer ML1'. The term "same layer" does not always mean that the thickness of the layer or the height of the layer in a cross-sectional view is the same.

In some embodiments, the first insulating layer IN1 and the second gate insulating layer GI2 are in a same layer and include a same material. Optionally, the first insulating layer IN1, the third insulating layer IN1', and the second gate insulating layer GI2 are in a same layer and include a same material.

In some embodiments, the capacitor electrode CE and the second metal layer ML2 are in a same layer and include a same material. Optionally, the capacitor electrode CE, the second metal layer ML2, and the fourth metal layer ML2' are in a same layer and include a same material.

In some embodiments, the inter-layer dielectric layer ILD and the second insulating layer IN2 are in a same layer and include a same material. Optionally, the inter-layer dielectric layer ILD, the second insulating layer IN2, and the fourth insulating layer IN2' are in a same layer and include a same material. Optionally, the inter-layer dielectric layer ILD and the second insulating layer IN2 include a same inorganic insulating material. Optionally, the inter-layer dielectric layer ILD, the second insulating layer IN2, and the fourth insulating layer IN2' include a same inorganic insulating material.

In some embodiments, the planarization layer PLN and the second insulating layer IN2 are in a same layer and include a same material. Optionally, the planarization layer PLN, the second insulating layer IN2, and the fourth insulating layer IN2' are in a same layer and include a same material. Optionally, the planarization layer PLN and the second insulating layer IN2 include a same organic photoresist material. Optionally, the planarization layer PLN, the second insulating layer IN2, and the fourth insulating layer IN2' include a same organic photoresist material.

In another aspect, the present disclosure provides a method of fabricating a display substrate having a display area and a peripheral area. In some embodiments, the method includes forming a plurality of light emitting elements on a base substrate and in the display area; forming an encapsulating layer on a side of the plurality of light emitting elements away from the base substrate to encapsulate the plurality of light emitting elements; and forming a first separation pillar in the peripheral area and on the base substrate, the first separation pillar forming a first enclosure substantially surrounding a first area. Optionally, forming the first separation pillar comprises forming a plurality of metal layers and a plurality of insulating layers alternately stacked on the base substrate. Optionally, a width along a cross-pillar direction across the first enclosure and from the display area toward the first separation pillar of a respective one of the plurality of insulating layers is greater than a width of a respective one of the plurality of metal layer along the cross-pillar direction. Optionally, an orthographic projection of the respective one of the plurality of insulating layers on the base substrate is larger than and covers an orthographic projection of the respective one of the plurality of metal layers on the base substrate.

In some embodiments, the method further includes forming, in a same patterning process (e.g., an open mask process) in a same layer using a same material, an organic functional layer extending substantially throughout the display area as a unitary layer, and a residual organic functional layer in the peripheral area and on a side of the first separation pillar away from the base substrate. Optionally, the residual organic functional layer is isolated from the organic functional layer by a lateral side of the first separation pillar. Optionally, a width of the residual organic functional layer along the cross-pillar direction is greater than the width of the respective one of the plurality of metal layer along the cross-pillar direction. Optionally, an orthographic projection of the residual organic functional layer on the base substrate is larger than and covers an orthographic projection of the respective one of the plurality of metal layers on the base substrate.

In some embodiments, the method further includes forming, in a same patterning process (e.g., an open mask process) in a same layer using a same material, a cathode layer extending substantially throughout the display area as a unitary layer, and a residual cathode layer in the peripheral area and on a side of the first separation pillar away from the base substrate. Optionally, the residual cathode layer is isolated from the cathode layer by a lateral side of the first separation pillar. Optionally, a width of the residual cathode layer along the cross-pillar direction is greater than the width of the respective one of the plurality of metal layer along the cross-pillar direction. Optionally, an orthographic projection of the residual cathode layer on the base substrate is larger than and covers an orthographic projection of the respective one of the plurality of metal layers on the base substrate.

In some embodiments, the step of forming the first separation pillar includes forming a first metal layer on the base substrate; forming a first insulating layer on a side of the first metal layer away from the base substrate; forming a second metal layer on a side of the first insulating layer away from the first metal layer; and forming a second insulating layer on a side of the second metal layer away from the first insulating layer. Optionally, the first insulating layer is formed to be in direct contact with the first metal layer on one side and in direct contact with the second metal layer on another side. Optionally, the second metal layer is formed to be in direct contact with the first insulating layer on one side and in direct contact with the second insulating layer on another side.

In some embodiments, the method further includes forming a plurality of thin film transistors. Optionally, the step of forming a respective one of the plurality of thin film transistors comprises forming a gate electrode. Optionally, the method further includes forming a gate insulating layer on a side of the gate electrode away from the base substrate; and forming a capacitor electrode on a side of the gate insulating layer away from the gate electrode. Optionally, the gate electrode and the first metal layer are formed from a same material deposited in a same deposition process. Optionally, the gate insulating layer and the first insulating layer are formed from a same material deposited in a same deposition process. Optionally, the capacitor electrode and the second metal layer are formed from a same material deposited in a same deposition process.

In some embodiments, the steps of forming the plurality of thin film transistor and forming the first separation pillar include forming a first conductive material layer on the base substrate throughout the display area and at least a portion of the peripheral area; patterning the first conductive material layer to form the gate electrode in the display area and a first metal precursor layer in the peripheral area; forming a first insulating material layer on a side of the gate electrode away from the base substrate, and throughout the display area and at least a portion of the peripheral area; patterning the first insulating material layer in the display area to form the gate insulating layer in the display area and the first insulating layer in the peripheral area; forming a second conductive material layer on a side of the gate insulating layer away from the base substrate, and throughout the display area and at least a portion of the peripheral area; patterning the second conductive material layer to form the capacitor electrode in the display area and the second metal precursor layer in the peripheral area; forming a second insulating material layer on a side of the capacitor electrode away from the base substrate, and throughout the display area and at least a portion of the peripheral area; patterning the second insulating material layer to form an insulating layer in the display area and the second insulating layer in the peripheral area; and etching the first metal precursor layer and the second metal precursor layer from lateral sides of the first metal precursor layer and the second metal precursor layer, respectively, in a same etching process, to form the first metal layer and the second metal layer. Optionally, widths of the first metal precursor layer, the first insulating layer, the second metal precursor layer, and the second insulating layer, along the cross-pillar direction, are substantially the same. Optionally, orthographic projections of the first metal precursor layer, the first insulating layer, the second metal precursor layer, and the second insulating layer on the base substrate are substantially co-extensive and overlapping.

In some embodiments, the method further includes forming an inter-layer dielectric layer on a side of the capacitor electrode away from the base substrate. Optionally, the inter-layer dielectric layer and the second insulating layer are formed from a same material deposited in a same deposition process. Optionally, the inter-layer dielectric layer and the second insulating layer include a same inorganic insulating material In some embodiments, the method further includes forming an inter-layer dielectric layer on a side of the capacitor electrode away from the base substrate; and forming a planarization layer on a side of the inter-layer dielectric layer away from the base substrate. Optionally, the planarization layer and the second insulating layer are formed from a same material deposited in a same deposition process. Optionally, the planarization layer and the second insulating layer include a same organic photoresist material.

In some embodiments, the method further includes forming an electrode material layer; and etching the electrode material layer to form an anode of a respective one of the plurality of light emitting elements in the display area. Optionally, etching the first metal precursor layer and the second metal precursor layer and etching the electrode material layer are performed in a same process and using a same etchant.

In some embodiments, the method further includes forming a second separation pillar in the peripheral area and on the base substrate, the second separation pillar forming a second enclosure substantially surrounding a second area. Optionally, the first separation pillar substantially surrounds the second separation pillar. Optionally, the first enclosure substantially surrounds a window region of the display substrate. Optionally, the display substrate has an aperture extending through the window region for installing an accessory therein.

Figure 5A:
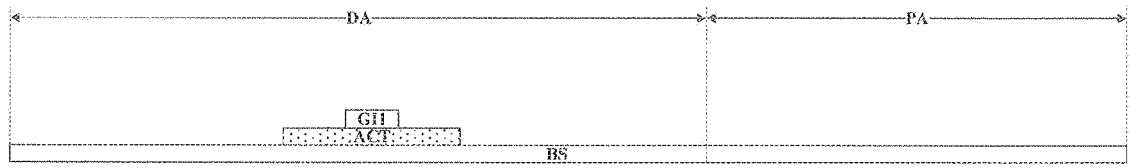
FIGS. 5A to 5H illustrate a method of fabricating a display substrate in some embodiments according to the present disclosure.

FIGS. 5A to 5H illustrate a method of fabricating a display substrate in some embodiments according to the present disclosure. Referring to FIG. 5A, an active layer ACT is formed on a base substrate BS; and a first gate insulating layer GI1 is formed on a side of the active layer ACT away from the base substrate BS. The active layer ACT and the first gate insulating layer GI1 are formed in a display area DA of the display substrate.

Figure 5B:

Referring to FIG. 5B, a gate electrode G is formed in the display area DA and on a side of the first gate insulating layer GI1 away from the base substrate BS. In the peripheral area PA, a first metal precursor layer MPL1 and a third metal precursor layer MPL1' are formed on the base substrate BS. The gate electrode G, the first metal precursor layer MPL1, and the third metal precursor layer MPL1' are formed in a same patterning process using a same mask plate and a same conductive material. For example, the gate electrode G, the first metal precursor layer MPL1, and the third metal precursor layer MPL1' may be formed by patterning a same conductive material layer deposited on the base substrate BS in a same deposition process.

Various appropriate conductive electrode materials and various appropriate fabricating methods may be used to make the first metal precursor layer MPL1 and the third metal precursor layer MPL1'. For example, a conductive electrode material may be deposited on the substrate by, e.g., sputtering or vapor deposition, and patterned by, e.g., lithography such as a wet etching process to form a gate electrode layer. Examples of appropriate conductive electrode materials include, but are not limited to, aluminum, chromium, tungsten, titanium, tantalum, molybdenum, copper, and alloys or laminates containing the same. Optionally, the first metal precursor layer MPL1 and the third metal precursor layer MPL1' are formed using molybdenum. Optionally, the first metal precursor layer MPL1 and the third metal precursor layer MPL1' are formed using a same material as the gate electrode G.

Figure 5C:
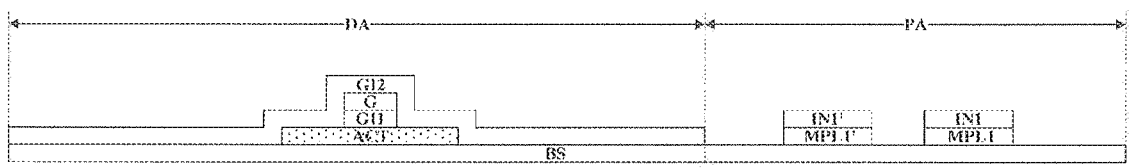

Referring to FIG. 5C, a second gate insulating layer GI2 is formed in the display area DA and on a side of the gate electrode G away from the base substrate BS. In the peripheral area PA, a first insulating layer IN1 is formed on a side of the first metal precursor layer MPL1 away from the base substrate BS, and a third insulating layer IN1' is formed on a side of the third metal precursor layer MPL1' away from the base substrate BS. The second gate insulating layer GI2, the first insulating layer IN1, and the third insulating layer IN1' are formed in a same patterning process using a same mask plate and a same material. For example, the second gate insulating layer GI2, the first insulating layer IN1, and the third insulating layer IN1' may be formed by patterning a same insulating material layer deposited on the base substrate BS in a same deposition process.

Various appropriate insulating materials and various appropriate fabricating methods may be used to make the first insulating layer IN1 and the third insulating layer IN1' For example, an insulating material may be deposited on the substrate by a plasma-enhanced chemical vapor deposition process. Examples of materials suitable for making the first insulating layer IN1 and the third insulating layer IN1' include, but are not limited to, silicon oxide (SiOy), silicon nitride (SiNy, e.g., $Si_3N_4$), silicon oxynitride ($SiO_xN_y$). Optionally, the first insulating layer IN1 and the third insulating layer IN1' are formed using a same material as the second gate insulating layer GI2.

Figure 5D:
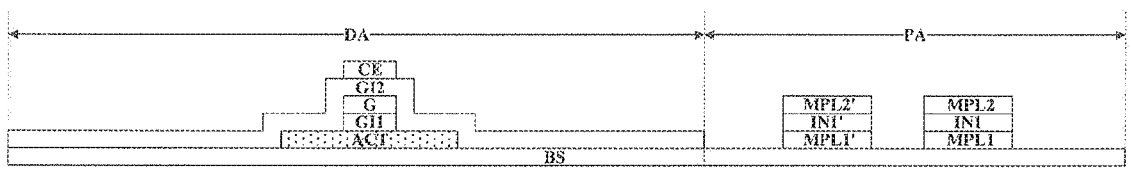

Referring to FIG. 5D, a capacitor electrode CE is formed in the display area DA and on a side of the second gate insulating layer GI2 away from the gate electrode G. In the peripheral area PA, a second metal precursor layer MPL2 is formed on a side of the first insulating layer IN1 away from the base substrate BS, and a fourth metal precursor layer MPL2' is formed on a side of the third insulating layer IN1' away from the base substrate BS. The capacitor electrode CE, the second metal precursor layer MPL2, and the fourth metal precursor layer MPL2' are formed in a same patterning process using a same mask plate and a same conductive material. For example, the capacitor electrode CE, the second metal precursor layer MPL2, and the fourth metal precursor layer MPL2' may be formed by patterning a same conductive material layer deposited on the base substrate BS in a same deposition process. Optionally, the patterning process includes a dry etching step.

Various appropriate conductive electrode materials and various appropriate fabricating methods may be used to make the second metal precursor layer MPL2 and the fourth metal precursor layer MPL2'. For example, a conductive electrode material may be deposited on the substrate by, e.g., sputtering or vapor deposition, and patterned by, e.g., lithography such as a wet etching process to form a gate electrode layer. Examples of appropriate conductive electrode materials include, but are not limited to, aluminum, chromium, tungsten, titanium, tantalum, molybdenum, copper, and alloys or laminates containing the same. Optionally, the second metal precursor layer MPL2 and the fourth metal precursor layer MPL2' are formed using molybdenum. Optionally, the second metal precursor layer MPL2 and the fourth metal precursor layer MPL2' are formed using a same material as the capacitor electrode CE.

Figure 5E:
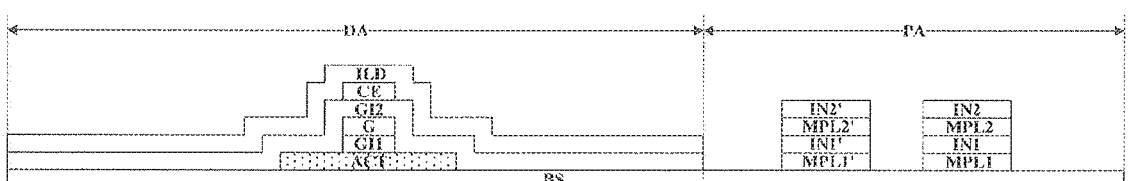

Referring to FIG. 5E, an inter-layer dielectric layer ILD is formed in the display area DA and on a side of the capacitor electrode CE away from the base substrate BS. In the peripheral area PA, a second insulating layer IN2 is formed on a side of the second metal precursor layer MPL2 away from the base substrate BS, and a fourth insulating layer IN2' is formed on a side of the fourth metal precursor layer MPL2' away from the base substrate BS. The inter-layer dielectric layer ILD, the second insulating layer IN2, and the fourth insulating layer IN2' are formed in a same patterning process using a same mask plate and a same material. For example, the inter-layer dielectric layer ILD, the second insulating layer IN2, and the fourth insulating layer IN2' may be formed by patterning a same insulating material layer deposited on the base substrate BS in a same deposition process. Optionally, the patterning process includes a dry etching step.

Various appropriate insulating materials and various appropriate fabricating methods may be used to make the second insulating layer IN2 and the fourth insulating layer IN2'. For example, an insulating material may be deposited on the substrate by a plasma-enhanced chemical vapor deposition process. Examples of materials suitable for making the second insulating layer IN2 and the fourth insulating layer IN2' include, but are not limited to, silicon oxide (SiOy), silicon nitride (SiNy, e.g., $Si_3N_4$), silicon oxynitride ($SiO_xN_y$). Optionally, the second insulating layer IN2 and the fourth insulating layer IN2' are formed using a same material as the inter-layer dielectric layer ILD.

Figure 5F:
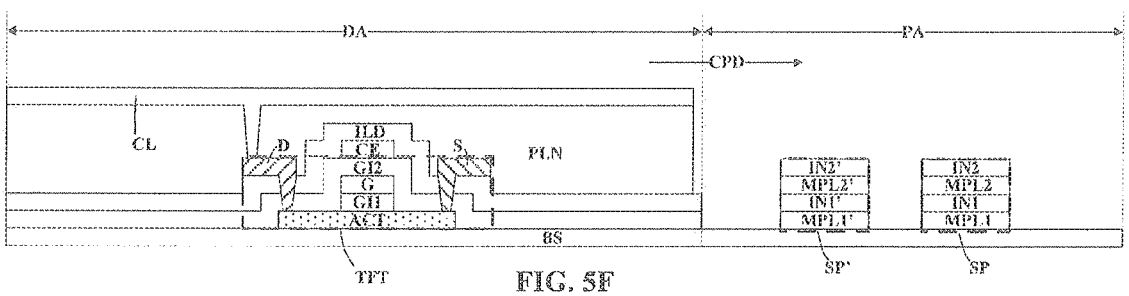

Referring to FIG. 5F, a source electrode S and a drain electrode D are formed on a side of the inter-layer dielectric layer ILD away from the base substrate BS, thereby forming a respective one of the plurality of thin film transistor TFT. The source electrode S and the drain electrode D are formed to respectively extend through the inter-layer dielectric layer ILD and the second gate insulating layer GI2 to connect to the active layer ACT. Subsequently, a planarization layer PLN is formed on a side of the source electrode S, the drain electrode D, and the inter-layer dielectric layer ILD away from the base substrate BS. A conductive material layer CL is formed at least in the display area DA. The conductive material layer CL is formed to extend through the planarization layer PLN to connect to the drain electrode D of the respective one of the plurality of thin film transistor TFT.

Various appropriate conductive electrode materials and various appropriate fabricating methods may be used to make the conductive material layer CL. For example, a conductive electrode material may be deposited on the substrate by, e.g., sputtering or vapor deposition, and patterned by, e.g., lithography such as a wet etching process to form a gate electrode layer. Examples of appropriate conductive electrode materials include, but are not limited to, aluminum, chromium, tungsten, titanium, tantalum, molybdenum, copper, and alloys or laminates containing the same. Optionally, the conductive material layer CL is formed using molybdenum.

Figure 5G:
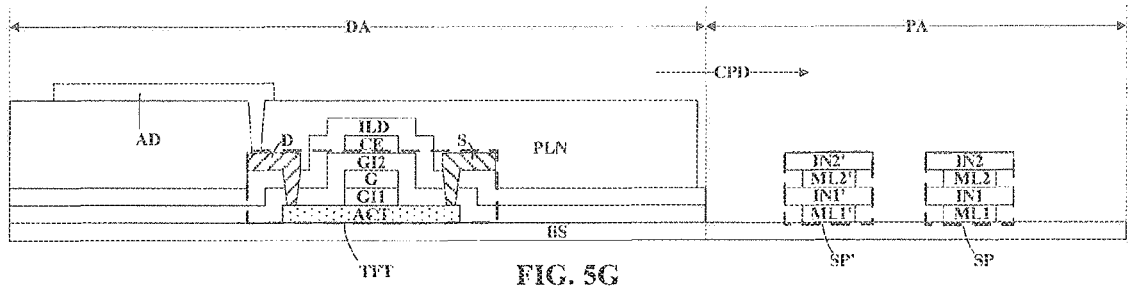

Referring to FIG. 5F and FIG. 5G, the conductive material layer CL is subsequently etched to form an anode AD in the display area DA. Optionally, the conductive material layer CL is etched using a wet etchant. Optionally, the wet etchant is an acidic etchant. In one example, the acidic etchant includes one or a combination of nitric acid, acetic acid, phosphoric acid, as well as one or more additives. The wet etchant selectively etches metallic materials such as the conductive material layer CL, the first metal precursor layer MPL1, the second metal precursor layer MPL2, the third metal precursor layer MPL1', and the fourth metal precursor layer MPL2'. The wet etchant is substantially non-reactive with various insulating layers of the display substrate, such as the inter-layer dielectric layer ILD, the second gate insulating layer GI2, and the planarization layer PLN.

During the step of etching of the conductive material layer CL, the first metal precursor layer MPL1, the second metal precursor layer MPL2, the third metal precursor layer MPL1', and the fourth metal precursor layer MPL2' are respectively etched by the same wet etchant on their lateral sides that are not covered by the insulating material. As shown in FIG. 5G, the first metal layer ML1, the second metal layer ML2, the third metal layer ML1', and the fourth metal layer ML2' are respectively formed by etching the first metal precursor layer MPL1, the second metal precursor layer MPL2, the third metal precursor layer MPL1', and the fourth metal precursor layer MPL2'. Each of the widths along the cross-pillar direction CPD of the first metal layer ML1, the second metal layer ML2, the third metal layer ML1', and the fourth metal layer ML2' is smaller than each of the widths along the cross-pillar direction CPD of the first insulating layer IN1, the second insulating layer IN2, the third insulating layer IN1', and the fourth insulating layer IN2'.

Figure 5H:
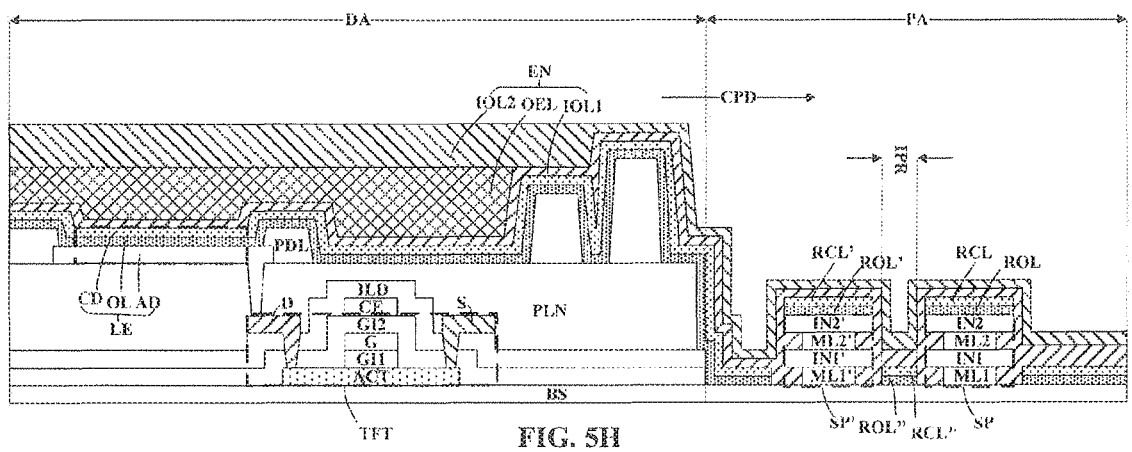

Referring to FIG. 5H, an organic functional layer OL, a first residual organic functional layer ROL, and a second residual organic functional layer ROL' are formed in a same open mask deposition process of depositing a same organic functional material. The first residual organic functional layer ROL is isolated from the organic functional layer OL by a lateral side of the first separation pillar SP, and the second residual organic functional layer ROL' is isolated from the organic functional layer OL by a lateral side of the second separation pillar SP'.

A cathode layer CD, a first residual cathode layer RCL, and a second residual cathode layer RCL' are formed in a same open mask deposition process of depositing a same cathode material. The first residual cathode layer RCL is isolated from the cathode layer CD by a lateral side of the first separation pillar SP, and the second residual cathode layer RCL' is isolated from the cathode layer CD by a lateral side of the second separation pillar SP'.

An encapsulating layer EN is then formed to encapsulate the plurality of light emitting elements LE. A first inorganic encapsulating sub-layer IOL1 and a second inorganic encapsulating sub-layer IOL2 extend into the peripheral area PA, and are respectively on a side of the second insulating layer IN2 and the fourth insulating layer IN2' away from the base substrate BS.

Figure 6A:
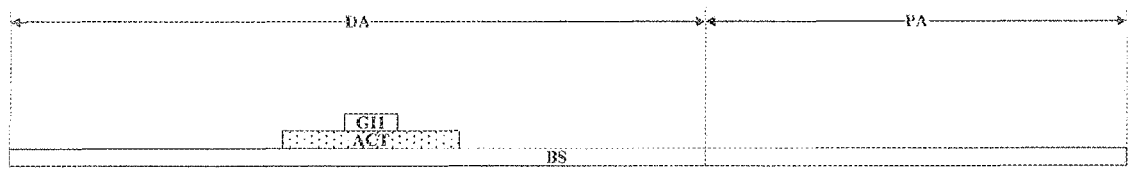
FIGS. 6A to 6H illustrate a method of fabricating a display substrate in some embodiments according to the present disclosure.
Figure 6B:
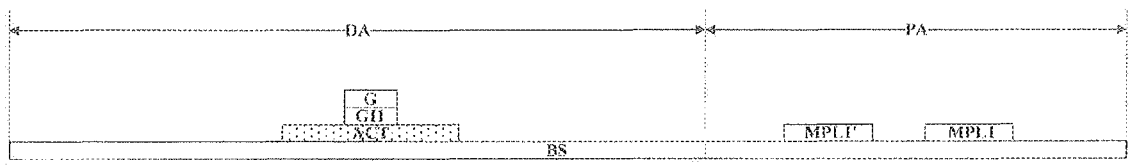
Figure 6C:
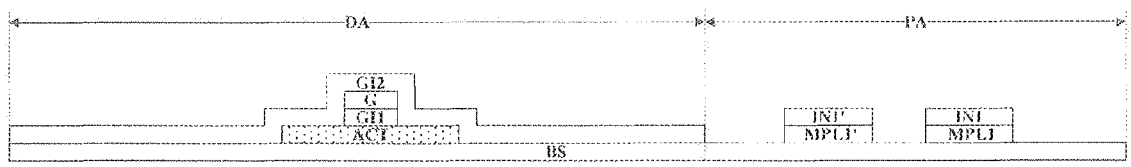
Figure 6D:
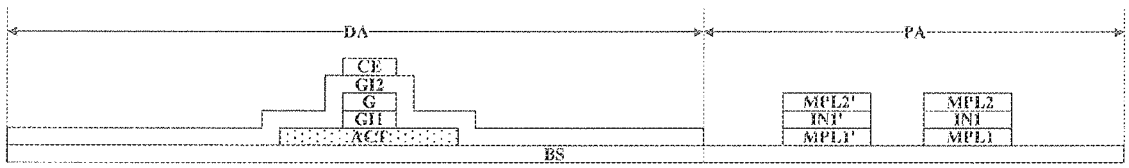
Figure 6E:
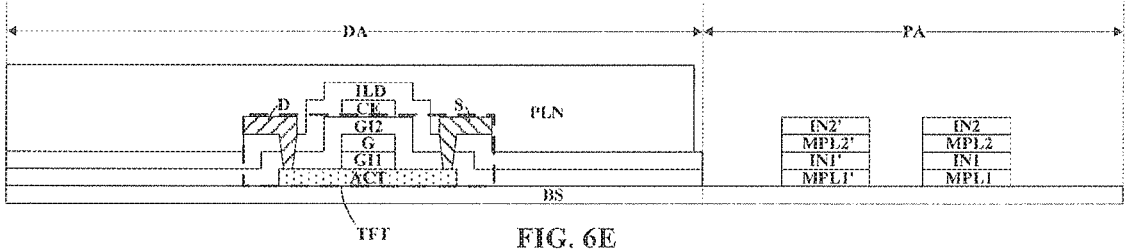

FIGS. 6A to 6H illustrate a method of fabricating a display substrate in some embodiments according to the present disclosure. The processes depicted in FIGS. 6A to 6D are substantially the same as those depicted in FIGS. 5A to 5D. Referring to FIG. 6E, subsequent to forming the capacitor electrode CE, an inter-layer dielectric layer ILD is formed in the display area DA and on a side of the capacitor electrode CE away from the base substrate BS; a source electrode S and a drain electrode D are formed on a side of the inter-layer dielectric layer ILD away from the base substrate BS, thereby forming a respective one of the plurality of thin film transistor TFT. Subsequently, a planarization layer PLN is formed in the display area DA and on a side of the source electrode S, the drain electrode D, and the inter-layer dielectric layer ILD away from the base substrate BS. In the peripheral area PA, a second insulating layer IN2 is formed on a side of the second metal precursor layer MPL2 away from the base substrate BS, and a fourth insulating layer IN2' is formed on a side of the fourth metal precursor layer MPL2' away from the base substrate BS. The planarization layer PLN, the second insulating layer IN2, and the fourth insulating layer IN2' are formed in a same patterning process using a same mask plate and a same material. For example, the planarization layer PLN, the second insulating layer IN2, and the fourth insulating layer IN2' may be formed by patterning a same insulating material layer deposited on the base substrate BS in a same deposition process. Optionally, the patterning process includes a lithography process.

Various appropriate insulating materials and various appropriate fabricating methods may be used for making the second insulating layer IN2 and the fourth insulating layer IN2'. For example, an insulating material may be deposited on the substrate by a plasma-enhanced chemical vapor deposition process. Examples of appropriate insulating materials for making the second insulating layer IN2 and the fourth insulating layer IN2' include, but are not limited to, silicon oxide (SiOy), silicon nitride (SiNy, e.g., $Si_3N_4$), silicon oxynitride ($SiO_xN_y$), polyimide, and an organic photoresist material.

In one example, the planarization layer PLN, the second insulating layer IN2, and the fourth insulating layer IN2' are formed by patterning a same insulating material layer deposited on the base substrate BS in a same deposition process. For example, an organic photoresist material is first deposited on the base substrate BS. The organic photoresist material layer is then patterned to form the planarization layer PLN, the second insulating layer IN2, and the fourth insulating layer IN2', respectively.

Figure 6F:
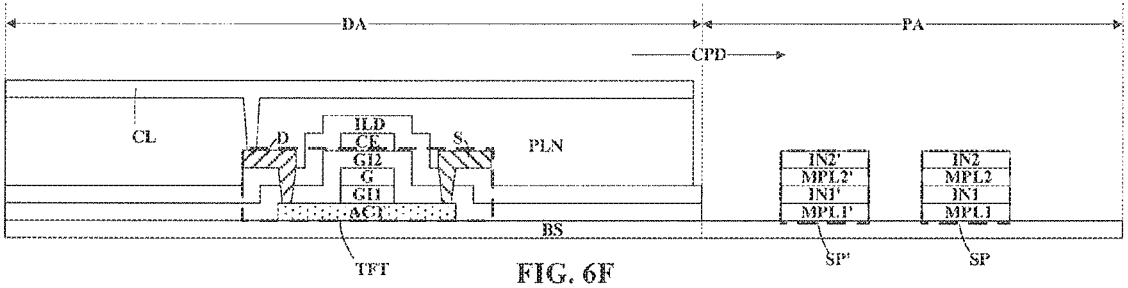
Figure 6G:
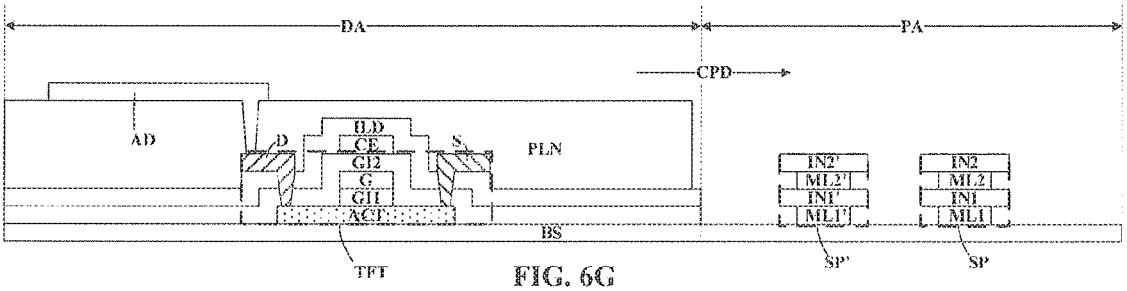
Figure 6H:
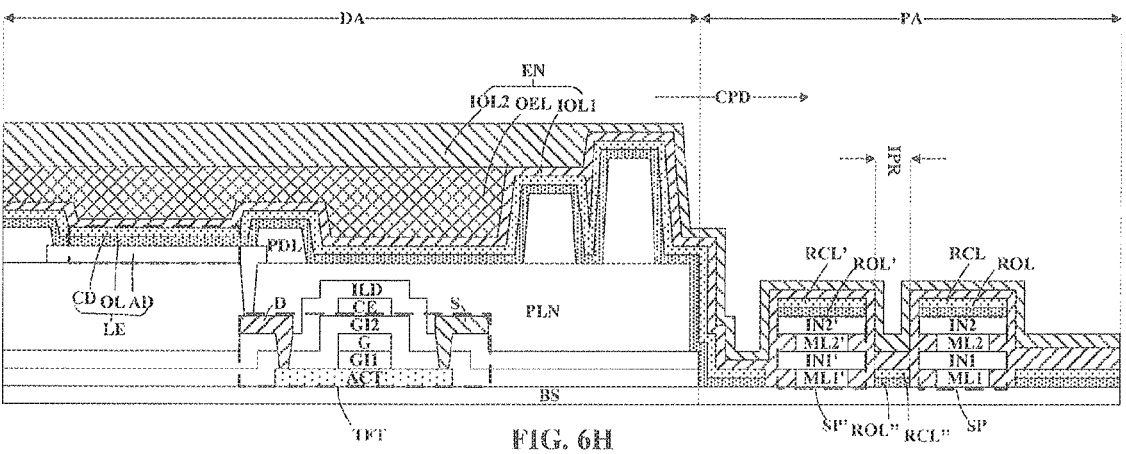

The processes depicted in FIGS. 6F to 6H are substantially the same as those depicted in FIGS. 5F to 5H.

In another aspect, the present disclosure provides a display apparatus including a display substrate described herein or fabricated by a method described herein, and one or more integrated circuits connected to the display substrate. Optionally, the display apparatus includes a display panel. Optionally, the display panel includes the display substrate described herein or fabricated by a method described herein, and a counter substrate. Examples of appropriate display apparatuses include, but are not limited to, an electronic paper, a mobile phone, a tablet computer, a television, a monitor, a notebook computer, a digital album, a GPS, etc. Optionally, the display apparatus further includes one or more integrated circuits connected to the display panel.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display substrate having a display area and a peripheral area, comprising:
a base substrate;
a plurality of light emitting elements on the base substrate and in the display area;
an encapsulating layer on a side of the plurality of light emitting elements away from the base substrate to encapsulate the plurality of light emitting elements; and
a first separation pillar in the peripheral area and on the base substrate, the first separation pillar forming a first enclosure substantially surrounding a first area;
wherein the first separation pillar comprises a plurality of metal layers and a plurality of insulating layers alternately stacked on the base substrate;
wherein a width of a respective one of the plurality of insulating layers along a cross-pillar direction across the first enclosure and from the display area toward the first separation pillar is greater than a width of a respective one of the plurality of metal layer along the cross-pillar direction.

2. The display substrate of claim 1, wherein an orthographic projection of the respective one of the plurality of insulating layers on the base substrate is larger than and covers an orthographic projection of the respective one of the plurality of metal layers on the base substrate.

3. The display substrate of claim 1, further comprising an organic functional layer extending substantially throughout the display area as a unitary layer; and
a residual organic functional layer in the peripheral area and on a side of the first separation pillar away from the base substrate;
wherein the residual organic functional layer and the organic functional layer are in a same layer and comprises a same material; and
the residual organic functional layer is isolated from the organic functional layer by a lateral side of the first separation pillar.

4. The display substrate of claim 3, wherein a width of the residual organic functional layer along the cross-pillar direction is greater than the width of the respective one of the plurality of metal layer along the cross-pillar direction; and
an orthographic projection of the residual organic functional layer on the base substrate is larger than and covers an orthographic projection of the respective one of the plurality of metal layers on the base substrate.

5. The display substrate of claim 1, further comprising a cathode layer extending substantially throughout the display area as a unitary layer; and
a residual cathode layer in the peripheral area and on a side of the first separation pillar away from the base substrate;
wherein the residual cathode layer and the cathode layer are in a same layer and comprises a same material; and
the residual cathode layer is isolated from the cathode layer by a lateral side of the first separation pillar.

6. The display substrate of claim 5, wherein a width of the residual cathode layer along the cross-pillar direction is greater than the width of the respective one of the plurality of metal layer along the cross-pillar direction; and
an orthographic projection of the residual cathode layer on the base substrate is larger than and covers an orthographic projection of the respective one of the plurality of metal layers on the base substrate.

7. The display substrate of claim 1, wherein the first separation pillar comprises:
a first metal layer on the base substrate;
a first insulating layer on a side of the first metal layer away from the base substrate;
a second metal layer on a side of the first insulating layer away from the first metal layer; and
a second insulating layer on a side of the second metal layer away from the first insulating layer;
wherein the first insulating layer is in direct contact with the first metal layer on one side and in direct contact with the second metal layer on another side; and
the second metal layer is in direct contact with the first insulating layer on one side and in direct contact with the second insulating layer on another side.

8. The display substrate of claim 7, further comprising a plurality of thin film transistors;
wherein a respective one of the plurality of thin film transistors comprises a gate electrode;
wherein the display substrate further comprises:
a gate insulating layer on a side of the gate electrode away from the base substrate; and
a capacitor electrode on a side of the gate insulating layer away from the gate electrode;
wherein the gate electrode and the first metal layer are in a same layer and comprise a same material;
the gate insulating layer and the first insulating layer are in a same layer and comprise a same material; and
the capacitor electrode and the second metal layer are in a same layer and comprise a same material.

9. The display substrate of claim 8, further comprising an inter-layer dielectric layer on a side of the capacitor electrode away from the base substrate;
wherein the inter-layer dielectric layer and the second insulating layer are in a same layer and comprise a same material.

10. The display substrate of claim 9, wherein the inter-layer dielectric layer and the second insulating layer comprises an inorganic insulating material.

11. The display substrate of claim 8, further comprising:
an inter-layer dielectric layer on a side of the capacitor electrode away from the base substrate; and
a planarization layer on a side of the inter-layer dielectric layer away from the base substrate;
wherein the planarization layer and the second insulating layer are in a same layer and comprise a same material.

12. The display substrate of claim 11, wherein the planarization layer and the second insulating layer comprises an organic photoresist material.

13. The display substrate of claim 1, further comprising a second separation pillar in the peripheral area and on the base substrate, the second separation pillar forming a second enclosure substantially surrounding a second area;
wherein the first separation pillar substantially surrounds the second separation pillar.

14. The display substrate of claim 1, wherein the first enclosure substantially surrounds a window region of the display substrate; and
the display substrate has an aperture extending through the window region for installing an accessory therein.

15. A display apparatus, comprising the display substrate of claim 1, and one or more integrated circuits connected to the display substrate.

16. A method of fabricating a display substrate having a display area and a peripheral area, comprising:

forming a plurality of light emitting elements on a base substrate and in the display area;

forming an encapsulating layer on a side of the plurality of light emitting elements away from the base substrate to encapsulate the plurality of light emitting elements; and forming a first separation pillar in the peripheral area and on the base substrate, the first separation pillar forming a first enclosure substantially surrounding a first area;

wherein forming the first separation pillar comprises forming a plurality of metal layers and a plurality of insulating layers alternately stacked on the base substrate;

wherein a width of a respective one of the plurality of insulating layers along a cross-pillar direction across the first enclosure and from the display area toward the first separation pillar is greater than a width of a respective one of the plurality of metal layer along the cross-pillar direction.

17. The method of claim 16, wherein forming the first separation pillar comprises:

forming a first metal layer on the base substrate;

forming a first insulating layer on a side of the first metal layer away from the base substrate;

forming a second metal layer on a side of the first insulating layer away from the first metal layer; and forming a second insulating layer on a side of the second metal layer away from the first insulating layer;

wherein the first insulating layer is formed to be in direct contact with the first metal layer on one side and in direct contact with the second metal layer on another side; and the second metal layer is formed to be in direct contact with the first insulating layer on one side and in direct contact with the second insulating layer on another side.

18. The method of claim 17, further comprising forming a plurality of thin film transistors;

wherein forming a respective one of the plurality of thin film transistors comprises forming a gate electrode;

wherein the method further comprises forming a gate insulating layer on a side of the gate electrode away from the base substrate; and forming a capacitor electrode on a side of the gate insulating layer away from the gate electrode;

wherein the gate electrode and the first metal layer are formed from a same material deposited in a same deposition process;

the gate insulating layer and the first insulating layer are formed from a same material deposited in a same deposition process; and the capacitor electrode and the second metal layer are formed from a same material deposited in a same deposition process.

19. The method of claim 18, wherein forming the plurality of thin film transistor and forming the first separation pillar comprise:

forming a first conductive material layer on the base substrate throughout the display area and at least a portion of the peripheral area;

patterning the first conductive material layer to form the gate electrode in the display area and a first metal precursor layer in the peripheral area;

forming a first insulating material layer on a side of the gate electrode away from the base substrate, and throughout the display area and at least a portion of the peripheral area;

patterning the first insulating material layer in the display area to form the gate insulating layer in the display area and the first insulating layer in the peripheral area;

forming a second conductive material layer on a side of the gate insulating layer away from the base substrate, and throughout the display area and at least a portion of the peripheral area;

patterning the second conductive material layer to form the capacitor electrode in the display area and a second metal precursor layer in the peripheral area;

forming a second insulating material layer on a side of the capacitor electrode away from the base substrate, and throughout the display area and at least a portion of the peripheral area;

patterning the second insulating material layer to form an insulating layer in the display area and the second insulating layer in the peripheral area; and etching the first metal precursor layer and the second metal precursor layer from lateral sides of the first metal precursor layer and the second metal precursor layer, respectively, in a same etching process, to form the first metal layer and the second metal layer;

wherein widths of the first metal precursor layer, the first insulating layer, the second metal precursor layer, and the second insulating layer, along the cross-pillar direction, are substantially the same; and orthographic projections of the first metal precursor layer, the first insulating layer, the second metal precursor layer, and the second insulating layer on the base substrate are substantially co-extensive and overlapping.

20. The method of claim 19, further comprising:

forming an electrode material layer; and etching the electrode material layer to form an anode of a respective one of the plurality of light emitting elements in the display area;

wherein etching the first metal precursor layer and the second metal precursor layer and etching the electrode material layer are performed in a same process and using a same etchant.

* * * * *